United States Patent
Funatsu et al.

(10) Patent No.: US 9,029,995 B2
(45) Date of Patent: May 12, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Katsuhiko Funatsu, Kanagawa (JP); Tomoaki Uno, Kanagawa (JP); Toru Ueguri, Kanagawa (JP); Yasushi Takahashi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/037,489

(22) Filed: Sep. 26, 2013

(65) Prior Publication Data
US 2014/0084436 A1 Mar. 27, 2014

(30) Foreign Application Priority Data

Sep. 26, 2012 (JP) ................................ 2012-212510

(51) Int. Cl.
H01L 23/48 (2006.01)
H01L 23/495 (2006.01)
H01L 21/56 (2006.01)
H01L 23/00 (2006.01)
H01L 23/31 (2006.01)

(52) U.S. Cl.
CPC .............. H01L 23/495 (2013.01); H01L 21/56 (2013.01); H01L 24/34 (2013.01); H01L 24/97 (2013.01); H01L 2224/32245 (2013.01); H01L 2224/48137 (2013.01); H01L 2224/48247 (2013.01); H01L 2224/49171 (2013.01); H01L 2224/73265 (2013.01); H01L 23/49575 (2013.01); H01L 2224/73221 (2013.01); H01L 2924/13091 (2013.01); H01L 23/49524 (2013.01); H01L 23/49562 (2013.01); H01L 2224/45144 (2013.01); H01L 2924/30107 (2013.01); H01L 23/3107 (2013.01); H01L 21/565 (2013.01); H01L 2224/97 (2013.01)

(58) Field of Classification Search
USPC .................. 257/676, 678, E23.034, E23.044, 257/E23.052, E23.079, 784, E25.031, 257/E23.085, 686, 723, 685, 777, 177
See application file for complete search history.

(56) References Cited

U.S. PATENT DOCUMENTS 6,316,922 B1 * 11/2001 Sugahara et al. ............. 323/224
6,700,793 B2 * 3/2004 Takagawa et al. ............ 361/777

(Continued)

FOREIGN PATENT DOCUMENTS

| JP | 2003-243594 A | 8/2003 |
| JP | 2005-260196 A | 9/2005 |
| JP | 2007-266218 A | 10/2007 |

Primary Examiner — A O Williams
(74) Attorney, Agent, or Firm — Miles & Stockbridge P.C.

(57) ABSTRACT

To enhance the reliability of connection between a semiconductor chip and a metal plate by ensuring sufficiently the thickness of a conductive material interposed between the semiconductor chip and the metal plate. A lead frame is arranged over a jig and a clip frame is arranged over protruding portions provided on the jig. In this state, a heating process (reflow) is performed. In this case, high melting point solders filling first spaces are melted in a state in which the first space is formed between a High-MOS chip and a High-MOS clip and the first space is formed between a Low-MOS chip and a Low-MOS clip. At this time, even when the high melting point solder is melted in the first space, the size (in particular, the height) of the first space does not change and the first space is maintained.

17 Claims, 27 Drawing Sheets

(56) References Cited

U.S. PATENT DOCUMENTS

| | | | |
|---|---|---|---|
| 7,295,453 B2 * | 11/2007 | Shiraishi et al. | 363/144 |
| 7,679,173 B2 * | 3/2010 | Uno et al. | 257/678 |
| 7,932,588 B2 | 4/2011 | Uno et al. | |

* cited by examiner

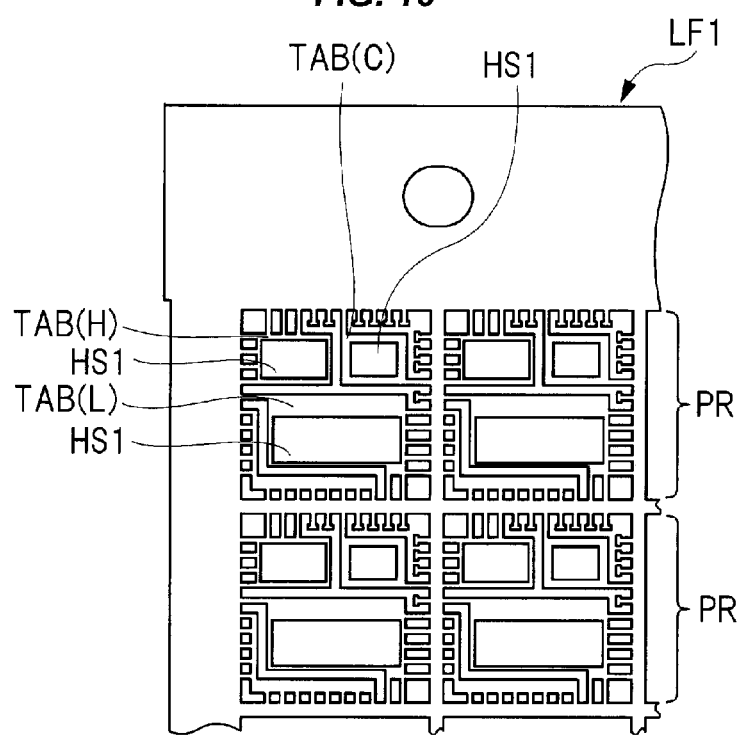

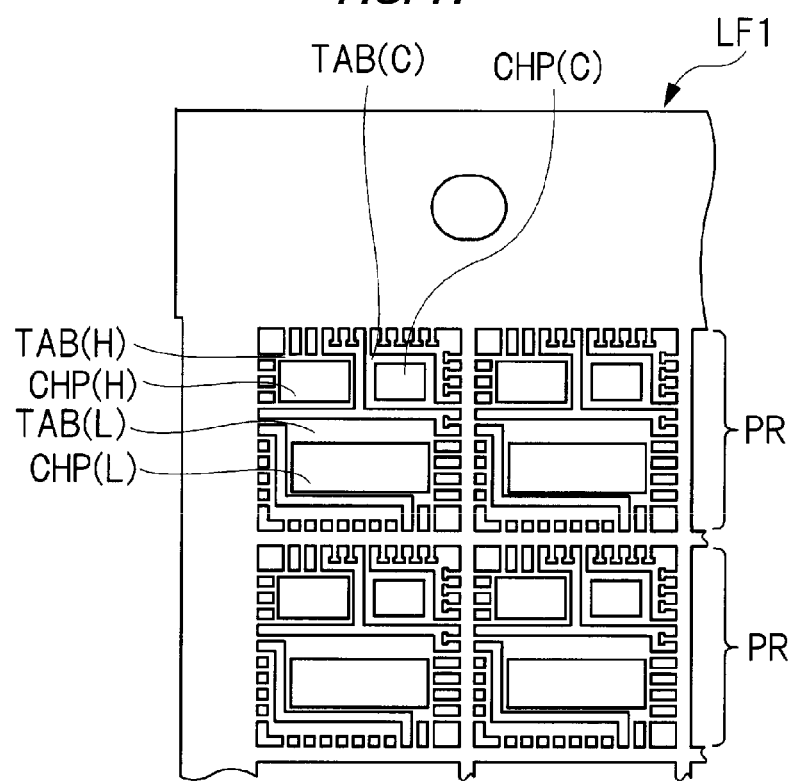

FIG. 16
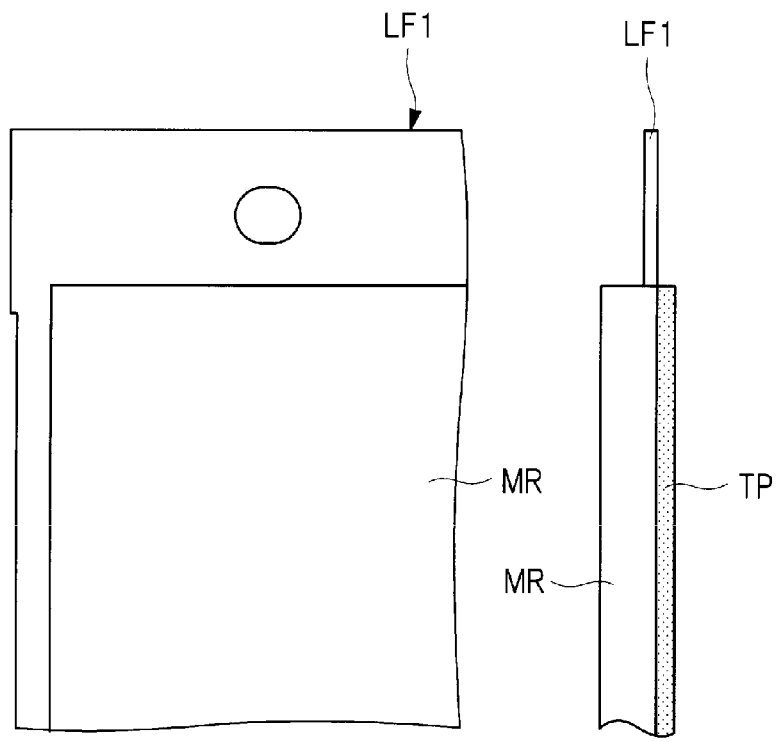
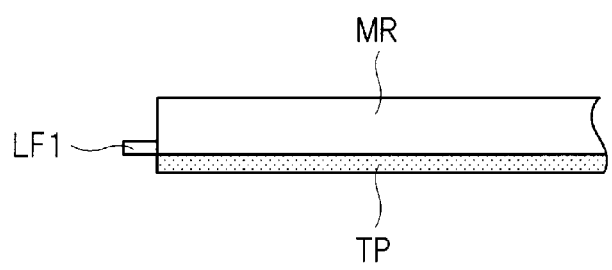

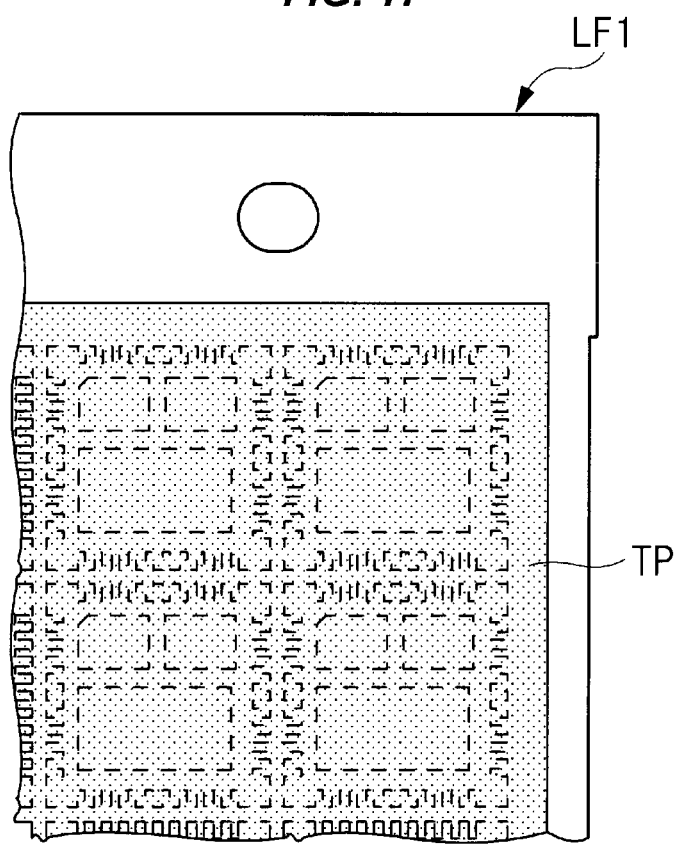

SEMICONDUCTOR DEVICE AND METHOD OF MANUFACTURING THE SAME

CROSS-REFERENCE TO RELATED APPLICATION

The disclosure of Japanese Patent Application No. 2012-212510 filed on Sep. 26, 2012 including the specification, drawings and abstract is incorporated herein by reference in its entirety.

BACKGROUND

The present invention relates to a semiconductor device and a manufacturing technique of the semiconductor device, for example, to an effective technique to be applied to a resin-sealed semiconductor device and a manufacturing technique of the resin-sealed semiconductor device.

Japanese Patent Laid-Open No. 2005-260196 (Patent Document 1) describes a technique in which a semiconductor chip is mounted over a conductive plate, the semiconductor chip and the conductive plate are coupled by a coupling member, and thereafter the semiconductor chip and the coupling member are coated with an electrical insulating coating material. In particular, Patent Document 1 describes a technique for collectively coating a plurality of semiconductor chips mounted over the conductive plate.

Japanese Patent Laid-Open No. 2003-243594 (Patent Document 2) describes a technique in which a conductor pattern is formed by applying a lithography technique and an etching technique to a metal film formed over a support substrate, and a semiconductor chip is fixed over the conductor pattern. In Patent Document 2, after that, the semiconductor chip and the conductor pattern are coupled by using a metal piece, and thereafter the semiconductor chip and the metal piece are sealed by an insulating resin.

Japanese Patent Laid-Open No. 2007-266218 (Patent Document 3) describes a technique in which a protrusion is provided on a surface of a metal plate, which is electrically coupled to a bonding pad of a semiconductor chip and which is on a side facing the bonding pad, to thereby forcibly ensure a thickness of an adhesive layer between the bonding pad and the metal plate.

SUMMARY

For example, a semiconductor device is formed with a semiconductor chip in which a semiconductor element such as a MOSFET (Metal Oxide Semiconductor Field Effect Transistor) is formed and a package formed so as to cover the semiconductor chip. Such structures of the package of the semiconductor device include a structure in which the semiconductor chip and a lead are coupled by a metal plate instead of a metal wire in order to, for example, reduce on-resistance.

In this structure, the semiconductor chip and the metal plate are connected by solder, and thus it is necessary to secure a sufficient thickness of the solder from the viewpoint of enhancing the reliability of the connection between the semiconductor chip and the metal plate. Because of this, for example, as in Patent Document 3, a protrusion is provided on a rear surface of the metal plate and the protrusion is pressed to the semiconductor chip, and thus the thickness of the solder between the semiconductor chip and the metal plate is ensured.

However, along with the downsizing of a semiconductor device, the sizes of the semiconductor chip and the metal plate also become smaller, and thus it is becoming difficult to form protrusions on a small metal plate and there is an obvious risk that the number of protrusions formed on the metal plate cannot be ensured sufficiently. As a result, if the downsizing of semiconductor devices is advanced from now on, it is expected that it becomes difficult to sufficiently and stably ensure the thickness of the solder interposed between the semiconductor chip and the metal plate, in the structure in which protrusions are provided on the metal plate.

Therefore, there is required a technique for ensuring the thickness of the solder interposed between the semiconductor chip and the metal plate without providing protrusions on the metal plate.

The other problems and the new feature will become clear from the description of the present specification and the accompanying drawings.

According to a manufacturing method of a semiconductor device of an embodiment, while a first space is held between a first portion of a metal plate and an electrode pad of a semiconductor chip, a second lead frame is mounted over a first lead frame so that a conductive adhesive material is in contact with the first portion of the metal plate and the electrode pad of the semiconductor chip, in the first space. After that, in this state, a heating process for heating the conductive adhesive material at a first temperature is performed. At this time, the heating process is performed while the first space is maintained.

According to a semiconductor device of an embodiment, a metal plate includes a first portion electrically coupled to an electrode pad of a semiconductor chip, a second portion electrically coupled to a lead, a third portion connecting the first portion and the second portion, and a fourth portion which is coupled to the third portion and whose end portion extends to an outer edge of a sealing body as seen in a plan view. At this time, an end face of the fourth portion of the metal plate is exposed from a first side surface of a plurality of side surfaces of the sealing body, and the end face of the fourth portion and the first side surface of the sealing body form the same plane.

According to an embodiment, it is possible to ensure sufficiently the thickness of a conductive material interposed between the semiconductor chip and the metal plate, and thus it is possible to enhance the reliability of the connection between the semiconductor chip and the metal plate.

BRIEF DESCRIPTION OF THE DRAWINGS

FIG. 10 is a plan view showing a manufacturing process the semiconductor device according to the First Embodiment;

FIG. 11 is a plan view showing a manufacturing process of the semiconductor device following the process of FIG. 10;

FIG. 15A is a plan view showing the process and FIG. 15B is an enlarged plan view showing a partial region in FIG. 15A;

FIG. 16 is a diagram showing a manufacturing process of the semiconductor device following the process of FIGS. 15A and 15B;

FIG. 17 is a plan view as viewed from a rear surface in FIG. 16;

FIG. 18A is a plan view showing the process and FIG. 18B is a side view showing the process;

FIG. 19A is a plan view showing the process, FIG. 19B is a side view showing the process, and FIG. 19C is a plan view showing the semiconductor device separated into a chip by the process;

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, and the like (including the number, a numeric value, an amount, a range, and the like), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for the case where it is clearly specified in particular and where it is considered to be clearly indispensable from a theoretical point of view, or the like.

Similarly, in the following embodiments, when shape, position relationship, or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

Circuit Configuration and Operation of DC/DC Converter

Figure 1:
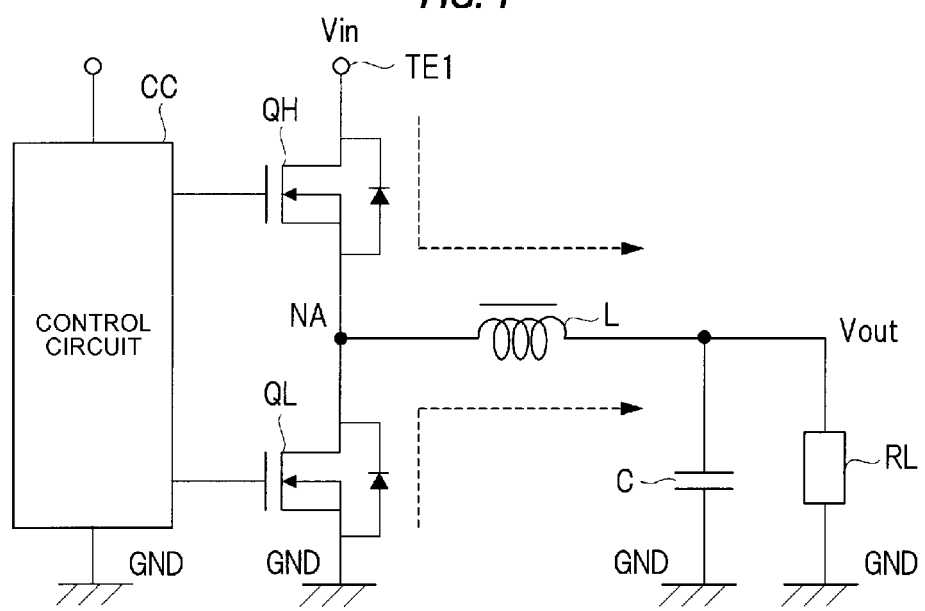
FIG. 1 is a diagram showing a circuit configuration of a step-down DC/DC converter.

FIG. 1 is a diagram showing a circuit configuration of a step-down DC/DC converter. As shown in FIG. 1, in the step-down DC/DC converter, a High-MOS transistor QH and a Low-MOS transistor QL are coupled in series between an input terminal TE1 and a ground GND. In addition, an inductor L and a load RL are coupled in series between a node NA between the High-MOS transistor QH and the Low-MOS transistor QL and the ground GND, and a capacitor C is coupled in parallel with the load RL.

Furthermore, a gate electrode of the High-MOS transistor QH and a gate electrode of the Low-MOS transistor QL are coupled to a control circuit CC. On/Off of the High-MOS transistor QH and On/Off of the Low-MOS transistor QL are controlled by the control circuit CC. Specifically, the control circuit CC performs control so as to turn off the Low-MOS transistor QL when turning on the High-MOS transistor QH and so as to turn on the Low-MOS transistor QL when turning off the High-MOS transistor QH.

Here, for example, when the High-MOS transistor QH is turned on and the Low-MOS transistor QL is turned off, current flows from the input terminal TE1 to the load RL through the High-MOS transistor QH and the inductor L. After that, when the High-MOS transistor QH is turned off and the Low-MOS transistor QL is turned on, first, the current flowing from the input terminal TE1 to the load RL through the High-MOS transistor QH and the inductor L is cut off because the High-MOS transistor QH is turned off. That is, the current flowing through the inductor L is cut off. However, when the current flowing through the inductor L decreases (is cut off), the inductor L tries to maintain the current flowing through the inductor L. At this time, since the Low-MOS transistor QL is turned on, a current flows from the ground GND to the load RL through the Low-MOS transistor QL and the inductor L. Thereafter, again the High-MOS transistor QH is turned on and the Low-MOS transistor QL is turned off. By repeating such operation, in the step-down DC/DC converter shown in FIG. 1, when an input voltage Vin is inputted into the input terminal TE1, an output voltage Vout lower than the input voltage Vin is outputted to both ends of the load RL.

Hereinafter, there will be briefly described the reason why the output voltage Vout lower than the input voltage Vin is outputted to both ends of the load RL when the input voltage Vin is inputted into the input terminal TE1, by repeating the above switching operation. Meanwhile, in the description below, it is assumed that the current flowing through the inductor L is not interrupted.

First, the High-MOS transistor QH performs the switching operation between an ON period $T_{ON}$ and an OFF period $T_{OFF}$ by control of the control circuit CC. In this case, the switching frequency is calculated by $f=1/(T_{ON}+T_{OFF})$.

Here, for example, in FIG. 1, the capacitor C inserted in parallel with the load RL has a function not to largely change the output voltage Vout in a short period of time. Namely, in the step-down DC/DC converter shown in FIG. 1, the capacitor C having a relatively large capacity is inserted in parallel with the load RL, and thus a ripple voltage included in the output voltage Vout is smaller than the output voltage Vout in a steady state. Therefore, the variation of the output voltage Vout in one cycle of the switching operation can be ignored.

First, the case where the High-MOS transistor QH is turned on is considered. At this time, it is assumed that the output voltage Vout does not vary, in one cycle, and thus it is possible to consider that a voltage applied to the inductor L is (Vin−Vout) which is constant. As a result, when the inductance of the inductor L is L1, the amount of increase in current $\Delta I_{ON}$ during the ON period $T_{ON}$ is provided by the following formula (1).

$$\Delta I_{ON}=(V\text{in}-V\text{out})/L1 \times T_{ON} \quad (1)$$

Next, the case where the High-MOS transistor QH is turned off is considered. In this case, the Low-MOS transistor QL is turned off, and thus the voltage applied to the inductor L is 0−Vout=−Vout. Therefore, the amount of increase in current $\Delta I_{OFF}$ during the OFF period $T_{OFF}$ is provided by the following formula (2).

$$\Delta I_{OFF}=-V\text{out}/L1 \times T_{OFF} \quad (2)$$

At this time, when a stable state is achieved, the current flowing through the inductor L does not increase or decrease in one cycle of the switching operation. That is, when the current flowing through the inductor L increases or decreases in one cycle, it means that the stable state has not been reached. Therefore, in the stable state, the following formula (3) holds.

$$\Delta I_{ON}+\Delta I_{OFF}=0 \quad (3)$$

When the relationship of the formula (1) and the relationship of the formula (2) are substituted into the formula (3), the following formula (4) can be obtained.

$$V\text{out}=V\text{in} \times T_{ON}/(T_{ON}+T_{OFF}) \quad (4)$$

In the formula (4), $T_{ON}>=0$ and $T_{OFF}>=0$ hold, and thus it is known that Vout<Vin holds. That is, it is known that the step-down DC/DC converter shown in FIG. 1 is a circuit that outputs the output voltage Vout lower than the input voltage Vin. From the formula (4), it is known that an arbitrary output voltage Vout lower than the input voltage Vin can be obtained by change of the ON period $T_{ON}$ and the OFF period $T_{OFF}$ by control of the switching operation of the control circuit CC. In particular, when performing control so that the ON period $T_{ON}$ and the OFF period $T_{OFF}$ are constant, a constant output voltage Vout can be obtained.

As described above, according to the step-down DC/DC converter shown in FIG. 1, it is known that the output voltage Vout lower than the input voltage Vin can be output by control of the ON/OFF of the High-MOS transistor QH and the ON/OFF of the Low-MOS transistor QL by the control circuit CC.

[Packaging Configuration (Basic Configuration) of Semiconductor Device According to First Embodiment]

The control circuit CC, the Low-MOS transistor QL, and the High-MOS transistor QH which are included in the step-down DC/DC converter described above are produced, for example, as a packaged semiconductor device. The packaged semiconductor device does not include the inductor L and the capacitor C shown in FIG. 1, and thus although the packaged semiconductor device is a semiconductor device constituting a part of the DC/DC converter, the packaged semiconductor device may be referred to as a semiconductor device constituting the DC/DC converter for convenience sake.

The semiconductor device is formed with a semiconductor chip in which a semiconductor element such as a MOSFET (Metal Oxide Semiconductor Field Effect Transistor) is formed and a package which is formed so as to cover the semiconductor chip. The package has (1) a function to electrically couple the semiconductor element formed in the semiconductor chip to an external circuit and (2) a function to protect the semiconductor chip from an external environment such as humidity and temperature and prevent damage due to vibration and shock and characteristic degradation of the semiconductor chip. Furthermore, the package also has (3) a function to facilitate handling of the semiconductor chip and (4) a function to dissipate heat generated at the time of operation of the semiconductor chip and exert, to a maximum extent, the function of the semiconductor element and the like.

As a package structure of the semiconductor device, there are various types of package structures such as a BGA (Ball Grid Array) package, a QFP (Quad Flat Package) package, and a QFN (Quad Flat Non-leaded Package) package. Among such various package forms, for example, the semiconductor device constituting a part of the DC/DC converter described above is packaged in the QFN package. Therefore, hereinafter, the packaging configuration of the semiconductor device of the QFN package constituting a part of the DC/DC converter will be described.

Figure 2:
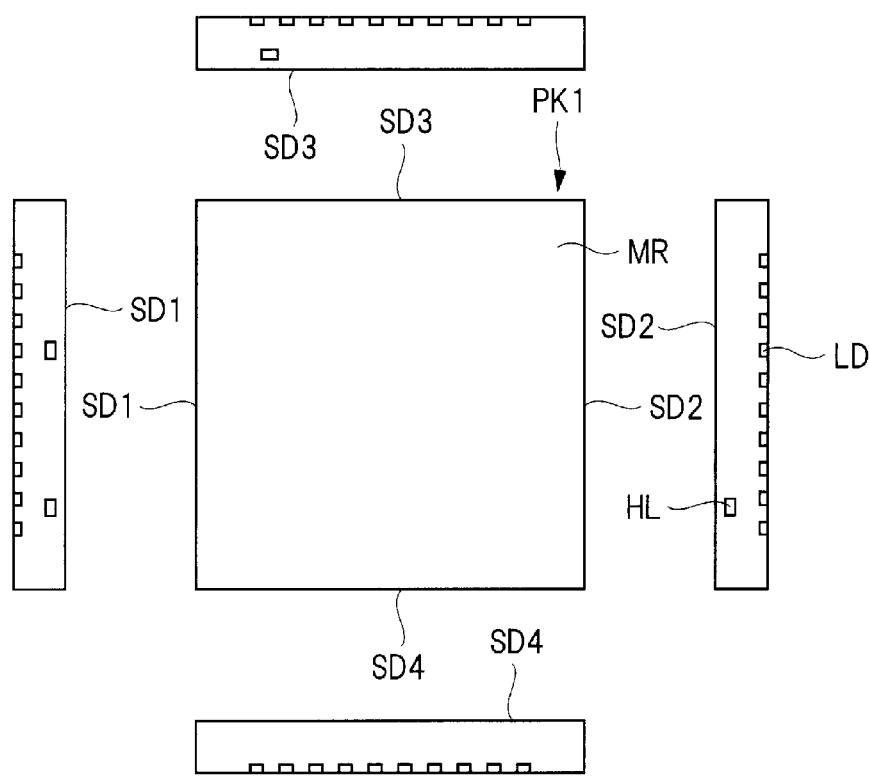
FIG. 2 is a diagram showing a packaging configuration of a semiconductor device according to a First Embodiment.

FIG. 2 is a diagram showing a packaging configuration of the semiconductor device PK1 according to the present First Embodiment. In FIG. 2, the diagram shown at the center is a plan view of the semiconductor device PK1 as viewed from the upper surface (surface) and side views are shown in each of the four directions. As shown in FIG. 2, the semiconductor device PK1 according to the present First Embodiment is covered with a resin MR having a rectangular shape. As known from the side views, leads LD are exposed from the resin MR in the side surfaces of the semiconductor device PK1.

Figure 3:
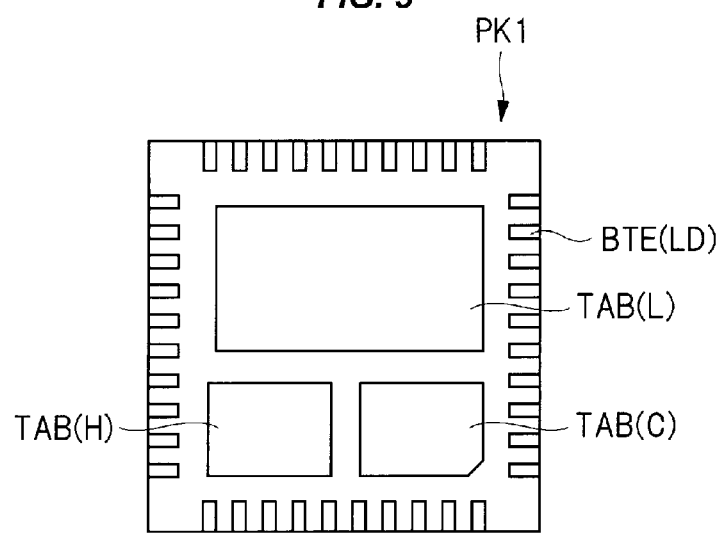
FIG. 3 is a plan view of the semiconductor device according to the First Embodiment as viewed from a lower surface (rear surface)

Next, FIG. 3 is a plan view of the semiconductor device PK1 according to the present First Embodiment as viewed from the lower surface (rear surface). As shown in FIG. 3, the rear surface of the semiconductor device PK1 is also covered with the resin MR, but a part (rear surface) of a chip mounting portion TAB(L), a chip mounting portion TAB(H), and a chip mounting portion TAB(C) is exposed from the resin MR. Since in this way, a part of the chip mounting portion TAB(L), the chip mounting portion TAB(H), and the chip mounting portion TAB(C) is exposed from the rear surface of the semiconductor device PK1, it is possible to enhance heat dissipation efficiency of the semiconductor device PK1. A plurality of rear surface terminals BTE is exposed in the outer peripheral area (outer peripheral portion) of the semiconductor device PK1 having a rectangular shape. The rear surface terminals BTE constitute a part of the leads LD.

Figure 4:
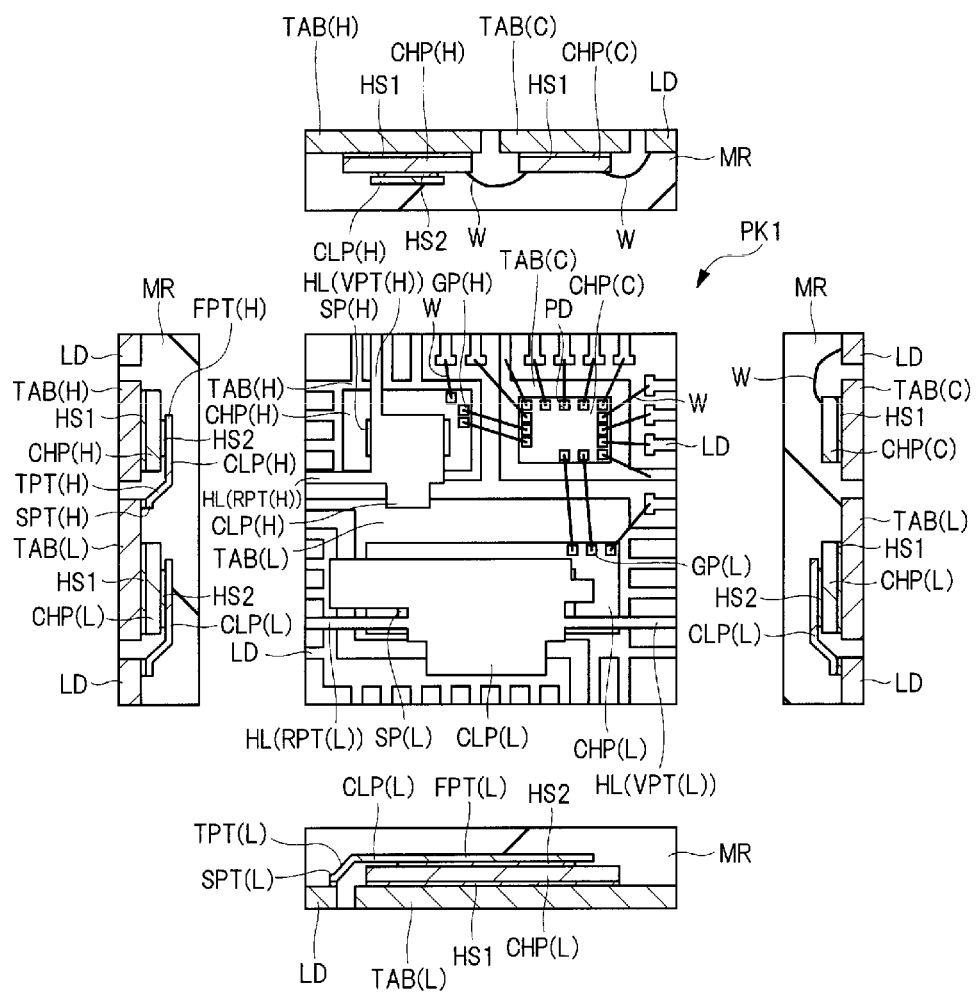
FIG. 4 is a diagram showing an internal configuration of the semiconductor device according to the First Embodiment.

Next, an internal configuration of the semiconductor device PK1 will be described. FIG. 4 is a diagram showing the internal configuration of the semiconductor device PK1 according to the present First Embodiment. In FIG. 4, the diagram shown at the center is a plan view of the semiconductor device PK1 as viewed from the upper surface through the resin MR and side views are shown in each of the four directions.

In the diagram shown at the center in FIG. 4, a Low-MOS chip CHP(L) containing, for example, silicon as a main component is mounted over the chip mounting portion TAB(L). In addition, in the surface of the Low-MOS chip CHP(L), a source electrode pad SP(L) and a gate electrode pad GP(L) including, for example, an aluminum film are formed. Note that, here, a nickel (Ni)-gold (Au) film is formed over the source electrode pad SP(L) in order to electrically couple a Low-MOS clip CLP(L) described later to the source electrode pad SP(L) via a high melting point solder HS2.

The lead LD is arranged in a part of the outside of the chip mounting portion TAB(L) and the lead LD and the source electrode pad SP(L) of the Low-MOS chip CHP(L) are electrically coupled by the Low-MOS clip (Low-MOS metal plate, Low-MOS conductor plate) CLP(L). That is, the Low-MOS clip CLP(L) including, for example, a cupper material is mounted over the source electrode pad SP(L) of the Low-MOS chip CHP(L) and an end portion of the Low-MOS clip CLP(L) is coupled to the lead LD. Specifically, as shown in the cross-sectional view in the lower part of FIG. 4, the Low-MOS chip CHP(L) is mounted over the chip mounting portion TAB(L) via a high melting point solder HS1, and the Low-MOS clip CLP(L) is mounted via the high melting point solder HS2 so as to span from over the Low-MOS chip CHP (L) to over the lead LD.

Next, in the diagram shown at the center in FIG. 4, a High-MOS chip CHP(H) containing, for example, silicon as a main component is mounted over the chip mounting portion TAB(H). In addition, in the surface of the High-MOS chip CHP(H), a source electrode pad SP(H) and a gate electrode pad GP(H) including, for example, an aluminum film are formed. Note that, here, a nickel (Ni)-gold (Au) film is formed over the source electrode pad SP(H) in order to electrically couple a High-MOS clip CLP(H) described later to the source electrode pad SP(H) via the high melting point solder HS2.

The chip mounting portion TAB(L) is arranged adjacent to the chip mounting portion TAB(H) and the chip mounting portion TAB(L) and the source electrode pad SP(H) of the High-MOS chip CHP(H) are electrically coupled by the High-MOS clip (High-MOS metal plate, High-MOS conductor plate) CLP(H). That is, the High-MOS clip CLP(H) including, for example, a cupper material is mounted over the source electrode pad SP(H) of the High-MOS chip CHP(H) and an end portion of the High-MOS clip CLP(H) is coupled to the chip mounting portion TAB(L). Specifically, as shown in the cross-sectional view in the left part of FIG. 4, the High-MOS chip CHP(H) is mounted over the chip mounting portion TAB (H) via the high melting point solder HS1, and the High-MOS clip CLP(H) is mounted via the high melting point solder HS2 so as to span from over the Low-MOS chip CHP(H) to over the chip mounting portion TAB(L).

Next, in the diagram shown at the center in FIG. 4, a driver IC chip CHP(C) containing, for example, silicon as a main component is mounted over the chip mounting portion TAB (C). Specifically, as shown in the cross-sectional view in the right part or the upper part of FIG. 4, the driver IC chip CHP(C) is mounted over the chip mounting portion TAB(C) via the high melting point solder HS1. In addition, the control circuit CC shown in FIG. 1 is formed inside the driver IC chip CHP(C). In an electrode pad PD including, for example, an aluminum film is formed on the surface of the driver IC chip CHP(C). The lead LD is arranged in a part of the outside of the chip mounting portion TAB(C) and the lead LD and the electrode pad PD formed on the surface of the driver IC chip CHP(C) are electrically coupled by a wire W including, for example, a gold wire. Furthermore, as shown in FIG. 4, the gate electrode pad GP (L) formed on the Low-MOS chip CHP(L) and the electrode pad PD formed on the driver IC chip CHP(C) are coupled by the wire W. In the same way, the gate electrode pad GP(H) formed on the High-MOS chip CHP(H) and the electrode pad PD formed on the driver IC chip CHP(C) are coupled by the wire W.

It will be described that the semiconductor device PK1 according to the present First Embodiment configured as described above constitutes a part of the DC/DC converter. In the diagram shown at the center in FIG. 4, the Low-MOS transistor QL (field effect transistor for switching) shown in FIG. 1 is formed inside the Low-MOS chip CHP(L) mounted over the chip mounting portion TAB(L). In addition, the source electrode pad SP(L) is formed on the surface of the Low-MOS chip CHP(L) and the source electrode pad SP(L) is electrically coupled to a source region of the Low-MOS transistor QL formed inside the Low-MOS chip CHP(L). Furthermore, the gate electrode pad GP(L) is formed on the surface of the Low-MOS chip CHP(L) and the gate electrode pad GP(L) is electrically coupled to a gate electrode of the Low-MOS transistor QL formed inside the Low-MOS chip CHP (L). Moreover, the rear surface of the Low-MOS chip CHP(L) serves as a drain region (drain electrode) of the Low-MOS transistor QL.

In the same way, in the diagram shown at the center in FIG. 4, the High-MOS transistor QH (field effect transistor for switching) shown in FIG. 1 is formed inside the High-MOS chip CHP(H) mounted over the chip mounting portion TAB (H). In addition, the source electrode pad SP(H) is formed on the surface of the High-MOS chip CHP(H) and the source electrode pad SP(H) is electrically coupled to a source region of the High-MOS transistor QH formed inside the High-MOS chip CHP(H). Furthermore, the gate electrode pad GP (H) is formed on the surface of the High-MOS chip CHP(H) and the gate electrode pad GP(H) is electrically coupled to a gate electrode of the High-MOS transistor QH formed inside the High-MOS chip CHP(H). Moreover, the rear surface of the High-MOS chip CHP(H) serves as a drain region (drain electrode) of the High-MOS transistor QH.

Here, as shown in FIG. 4, the rear surface (drain electrode) of the Low-MOS chip CHP(L) is electrically coupled to the chip mounting portion TAB(L). In addition, the chip mounting portion TAB(L) and the source electrode pad SP(H) formed on the High-MOS chip CHP(H) are coupled by the High-MOS clip CLP(H). Thereby, the drain electrode of the Low-MOS chip CHP(L) and the source electrode pad SP(H) of the High-MOS chip CHP(H) are electrically coupled to each other, and thus it is known that the series coupling of the High-MOS transistor QH and the Low-MOS transistor QL shown in FIG. 1 is realized.

The source electrode pad SP(L) formed on the surface of the Low-MOS chip CHP(L) is electrically coupled to the lead LD via the Low-MOS clip CLP(L). Therefore, it is possible to couple the source region of the Low-MOS transistor QL shown in FIG. 1 to the ground GND by coupling, to the ground, the lead LD electrically coupled to the Low-MOS clip CLP(L).

In contrast, the rear surface (drain electrode) of the High-MOS chip CHP(H) is electrically coupled to the chip mounting portion TAB(H) via the high melting point solder HS1. Therefore, it is possible to couple the drain region (drain electrode) of the High-MOS transistor QH shown in FIG. 1 to the input terminal TE1 by electrically coupling the chip mounting portion TAB(H) to the input terminal TE1. As described above, it is known that the semiconductor device PK1 according to the present First Embodiment shown in FIG. 4 constitutes a part of the DC/DC converter.

In the semiconductor device PK1 according to the present First Embodiment, for example, as shown in FIG. 4, the Low-MOS chip CHP(L) and the lead LD are electrically coupled by using the Low-MOS clip CLP(L) instead of a wire. In the same way, in the present First Embodiment, the High-MOS chip CHP(H) and chip mounting portion TAB(L) are electrically coupled by using the High-MOS clip CLP(H) instead of a wire.

This is because the semiconductor device PK1 according to the present First Embodiment is used as a component of the DC/DC converter and a large current flows in a current path coupled by the Low-MOS clip CLP(L) and the clip CLP(H), and thus the on-resistance is required to be reduced as much as possible. That is, the Low-MOS transistor QL and the High-MOS transistor QH through which a large current flows are formed in the Low-MOS chip CHP(L) and the High-MOS chip CHP(H), and the Low-MOS clip CLP(L) and the High-MOS clip CLP(H) are used instead of wires in order to fully elicit the characteristics of the transistors (power transistors). In particular, a copper material with low resistivity is used as the Low-MOS clip CLP(L) and the High-MOS clip CLP(H) and the contact areas can be large by the Low-MOS clip CLP(L) and the High-MOS clip CLP(H), and thus it is possible to reduce the on-resistances of the Low-MOS transistor QL and the High-MOS transistor QH.

Furthermore, from the viewpoint of reducing the on-resistances, solder is used instead of silver paste for coupling of the chip mounting portion TAB(L) to the Low-MOS chip CHP(L) mounted over the chip mounting portion TAB(L), and for coupling of the Low-MOS chip CHP(L) to the Low-MOS clip CLP(L). From the same viewpoint, solder is used instead of silver paste for coupling of the chip mounting portion TAB(H) to the High-MOS chip CHP(H) mounted over the chip mounting portion TAB(H), and for coupling of the High-MOS chip CHP(H) to the High-MOS clip CLP(H). That is, the silver paste has a configuration in which silver fillers are distributed inside a thermosetting resin, and the electrical conductivity and the thermal conductivity of the silver past are smaller than those of the solder. Therefore, the solder with an electrical conductivity greater than that of the silver paste is used in the semiconductor device PK1 used in the DC/DC converter whose on-resistance needs to be reduced, and thus the on-resistances of the Low-MOS transistor QL and the High-MOS transistor QH are reduced. In particular, in the semiconductor device PK1 according to the present First Embodiment, a current flows on the rear surface of the Low-MOS chip CHP(L) and the rear surface of the High-MOS chip CHP(H), and thus it is important to reduce the connection resistance by replacing the silver paste with the solder from the view point of reducing the on-resistance.

However, after the semiconductor device PK1 according to the present First Embodiment is completed as a product, the semiconductor device PK1 is mounted over a circuit board (mounting board). In this case, solder is used for coupling of the semiconductor device PK1 and the mounting board. In the case of the coupling by solder, the solder is melted for the coupling, and thus a heating process (reflow) is required.

Here, in the case where the solder used for coupling of the semiconductor device PK1 and the mounting board and the solder used inside the semiconductor device PK1 described above include the same material, the solder used inside the semiconductor device PK1 is also melted by the heating process (reflow) applied to the coupling of the semiconductor device PK1 and the mounting board. In this case, there occur problems such as a crack generated in a resin that seals the semiconductor device PK1 by a volume expansion due to melting of the solder and leakage of the melted solder to the outside.

Therefore, the high melting point solder HS1 and the high melting point solder HS2 are used for coupling of the chip mounting portion TAB(L) and the Low-MOS chip CHP(L) mounted over the chip mounting portion TAB(L) and for coupling of the Low-MOS chip CHP(L) and the Low-MOS clip CLP(L). In the same way, the high melting point solder HS1 and the high melting point solder HS2 are used for coupling of the chip mounting portion TAB(H) and the High-MOS chip CHP(H) mounted over the chip mounting portion TAB(H) and for coupling of the High-MOS chip CHP(H) and the High-MOS clip CLP(H). In this case, the high melting point solder HS1 and the high melting point solder HS2 used inside the semiconductor device PK1 are not melted by the heating process (reflow) applied to coupling of the semiconductor device PK1 and the mounting board. Therefore, it is possible to prevent the problems such as occurrence of a crack in a resin that seals the semiconductor device PK1 by a volume expansion due to melting of the high melting point solder HS1 and the high melting point solder HS2 and leakage of the melted solder to the outside.

As the solder used for coupling of the semiconductor device PK1 and the mounting board, a solder represented by tin (Sn)-silver (Ag)-copper (Cu) with a melting point of approximately 220° C. is used and the semiconductor device PK1 is heated to approximately 260° C. Therefore, for example, the high melting point solder in the present specification means a solder that does not melt even when heated to approximately 260° C. A typical example of the solder is, for example, a solder with a melting point of approximately 300° C. and a reflow temperature of approximately 350° C. and containing 90% by weight or more of Pb (lead).

Note that, in the present First Embodiment, exists the high melting point solder HS1 used for coupling of, for example, the chip mounting portion TAB(L) and the Low-MOS chip CHP(L) and or coupling of the chip mounting portion TAB(H) and the High-MOS chip CHP(H). In addition, there exists the high melting point solder HS2 used for coupling of the Low-MOS chip CHP(L) and the Low-MOS clip CLP(L) and for coupling of the High-MOS chip CHP(H) and the High-MOS clip CLP(H). Basically, in the present First Embodiment, it is assumed that the high melting point solder HS1 and the high melting point solder HS2 described above have the same material, but the high melting point solder HS1 and the high melting point solder HS2 can include different materials.

<Packaging Configuration (Characteristic Configuration) of Semiconductor Device According to a First Embodiment>

Next, a characteristic configuration of the semiconductor device PK1 according to the present First Embodiment will be described. The characteristics are based on ingenuity in manufacturing method made to enhance the connection reliability between the semiconductor chips (the Low-MOS chip CHP(L) and the High-MOS chip CHP(H)) and the metal plates (the Low-MOS clip CLP(L) and the High-MOS clip CLP(H)). That is, the characteristic configuration of the semiconductor device PK1 according to the present First Embodiment is generated by exercising ingenuity in the manufacturing method. That is, it can be said that the characteristic configuration of the semiconductor device according to the present First Embodiment is a result in which the characteristics of the manufacturing method are reflected. Note that the characteristics of the manufacturing method will be described later.

In FIG. 2, the semiconductor device PK1 according to the present First Embodiment is covered with a sealing body including a resin MR with a rectangular shape. The shape of the sealing body is a rectangle (for example, quadrangle) as seen in a plan view, and the sealing body has an upper surface, a lower surface opposite to the upper surface, and a plurality of side surfaces (four side surfaces) arranged between the upper surface and the lower surface. Specifically, as shown in FIG. 2, when the four side surfaces are referred to as side surfaces SD1 to SD4 respectively, the leads LD are exposed from the resin MR in each of the side surfaces SD1 to SD4. Furthermore, in the present First Embodiment, cross-sections of support leads HL are exposed from the side surfaces of the semiconductor device PK1. Specifically, two support leads HL are exposed from the side surface SD1, one support lead HL is exposed from the side surface SD2, and one support lead HL is exposed from the side surface SD3. In this way, the point that the support leads HL are exposed from the side surfaces SD1 to SD3 is the characteristic configuration (result) of the semiconductor device PK1 according to the present First Embodiment.

Next, the characteristics of the internal configuration of the semiconductor device PK1 according to the present First Embodiment will be described. In FIG. 4, the diagram shown at the center is a plan view of the semiconductor device PK1 as viewed from the upper surface through the resin MR, and side views are shown in each of the four directions.

Here, in FIG. 4, the characteristic of the present First Embodiment is that the support lead HL is formed integrally with the High-MOS clip CLP(H) and the support lead HL reaches an outer edge of the sealing body including the resin MR. Similarly, a feature point of the present First Embodiment is that the support lead HL is formed integrally with the Low-MOS clip CLP(L) and the support lead HL reaches an outer edge of the sealing body including the resin MR.

For example, by focusing attention on the Low-MOS chip CHP(L), in FIG. 4, the Low-MOS chip CHP(L) includes a first portion FPT(L) electrically coupled to the source electrode pad SP(L) of the Low-MOS chip CHP(L) and a second portion SPT(L) electrically coupled to the lead LD. Furthermore, the Low-MOS clip CLP(L) includes a third portion TPT(L) connecting the first portion FPT(L) and the second portion SPT(L), and also includes a fourth portion RPT(L) (support lead HL) and a fifth portion VPT(L), which are coupled to the first portion FPT(L) and whose end portions extend to an outer edge of the sealing body as seen in a plan view. Here, the fourth portion RPT(L) of the Low-MOS clip CLP(L) indicates the support lead HL. In the present specification, for convenience sake, the same component may be referred to as the support lead HL or the fourth portion RPT(L) of the Low-MOS clip CLP(L), but both the support lead HL and the fourth portion RPT(L) of the Low-MOS clip CLP(L) indicate the same component.

At this time, an end face of the fourth portion RPT(L) (support lead HL) of the Low-MOS clip CLP(L) is exposed from the first side surface SD1 of the sealing body, and the end face of the fourth portion RPT(L) (support lead HL) and the first side surface SD1 of the sealing body form the same plane. Also, an end face of the fifth portion VPT(L) (support lead HL) of the Low-MOS clip CLP(L) is exposed from the second side surface SD2 of the sealing body, and the end face of the fifth portion VPT(L) (support lead HL) and the second side surface SD2 of the sealing body form the same plane.

In the same way, by focusing attention on the High-MOS chip CHP(H), in FIG. 4, the High-MOS chip CHP(H) includes a first portion FPT(H) electrically coupled to the source electrode pad SP(H) of the High-MOS chip CHP(H) and a second portion SPT(H) electrically coupled to the chip mounting portion TAB(L). Furthermore, the High-MOS chip CHP(H) includes a third portion TPT(H) connecting the first portion FPT(H) and the second portion SPT(H), and also includes a fourth portion RPT(H) (support lead HL) and a fifth portion VPT(H), which are coupled to the first portion FPT(H) and whose end portions extend to an outer edge of the sealing body as seen in a plan view.

At this time, an end face of the fourth portion RPT(H) (support lead HL) of the High-MOS clip CLP(H) is exposed from the first side surface SD1 of the sealing body, and the end face of the fourth portion RPT (H) (support lead HL) and the first side surface SD1 of the sealing body form the same plane. Furthermore, an end face of the fifth portion VPT (H) (support lead HL) of the High-MOS clip CLP(H) is exposed from the third side surface SD3 of the sealing body, and the end face of the fifth portion VPT (L) (support lead HL) and the third side surface SD3 of the sealing body form the same plane.

[Manufacturing Method of Semiconductor Device According to the Present First Embodiment]

For example, as shown in FIG. 4, the semiconductor device according to the present First Embodiment is the semiconductor device PK1 constituting the DC/DC converter and is packaged in the QFN package. Therefore, hereinafter, a technical idea of the present First Embodiment will be described by taking as an example the manufacturing method of the semiconductor device PK1 including QFN package constituting a part of the DC/DC converter.

Figure 5:
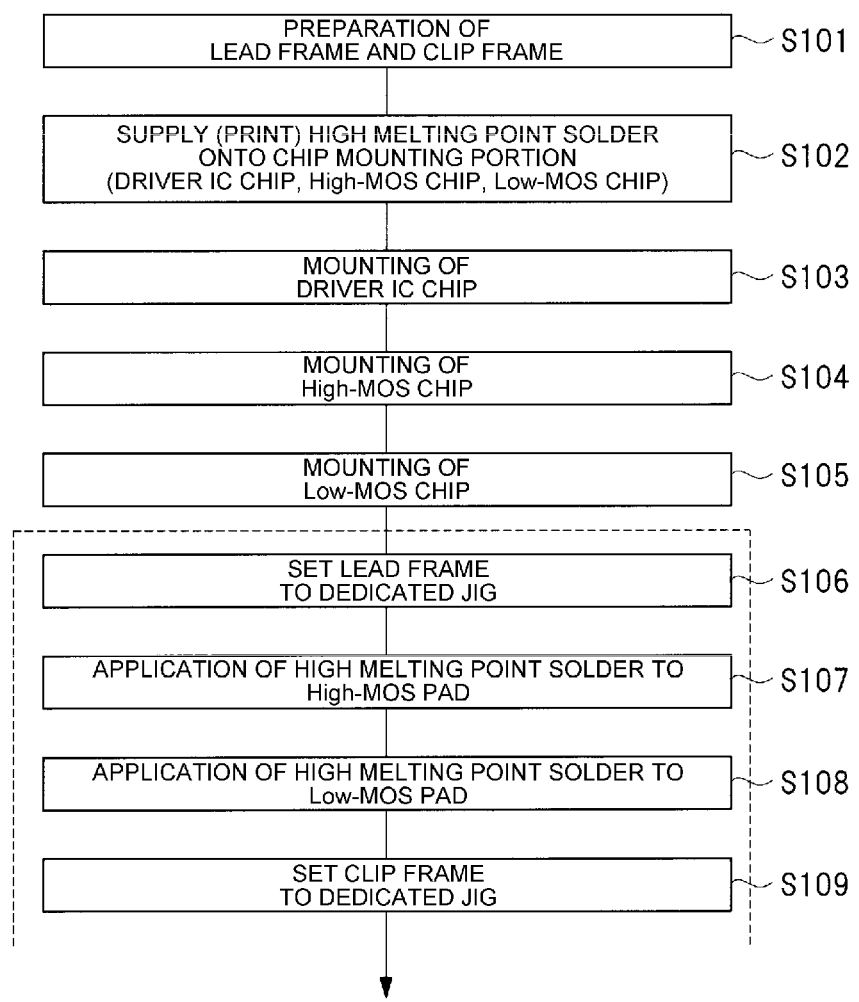
FIG. 5 is a flowchart showing a manufacturing flow of the semiconductor device according to the First Embodiment.
Figure 6:
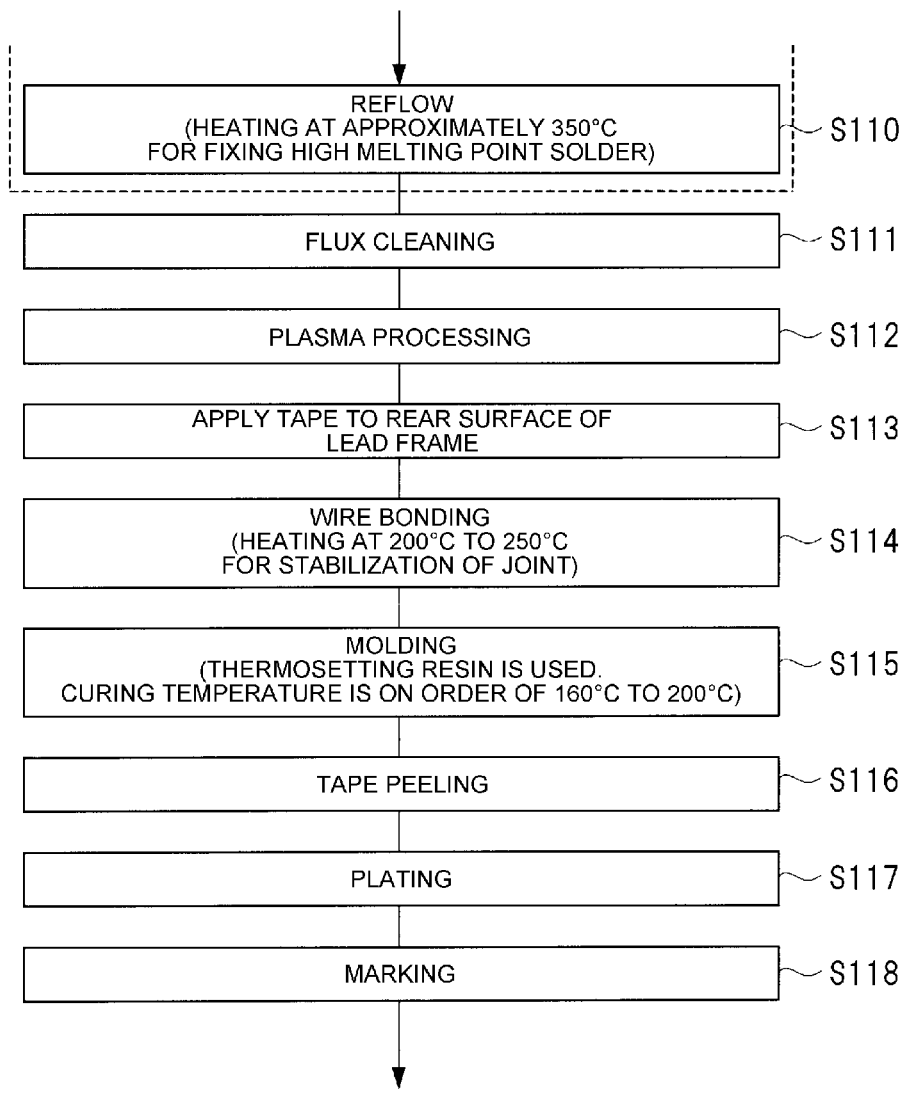
FIG. 6 is a flowchart showing a manufacturing flow of the semiconductor device according to the First Embodiment.
Figure 7:
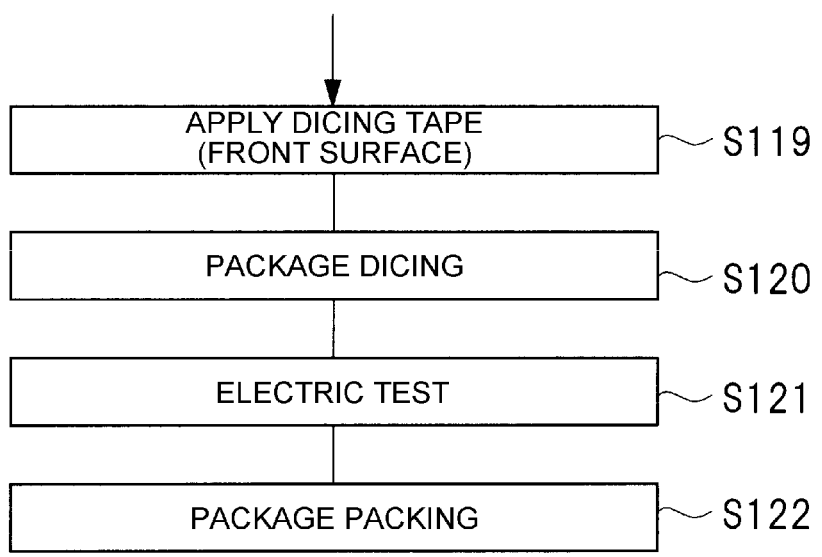
FIG. 7 is a flowchart showing a manufacturing flow of the semiconductor device according to the First Embodiment.

FIGS. 5 to 7 are flowcharts showing a manufacturing flow of the semiconductor device PK1 according to the present First Embodiment. FIGS. 8 to 19 are diagrams showing a manufacturing process of the semiconductor device PK1 according to the present First Embodiment.

Figure 8A:
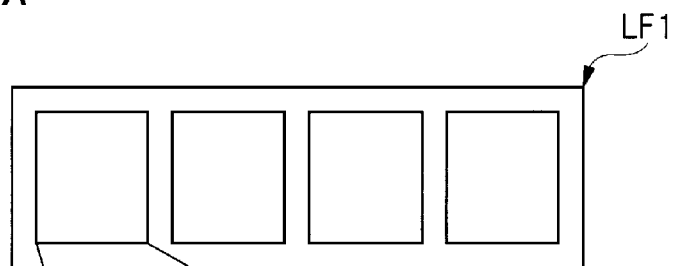
FIG. 8A is a diagram schematically showing an entire configuration of a lead frame.
Figure 8B:
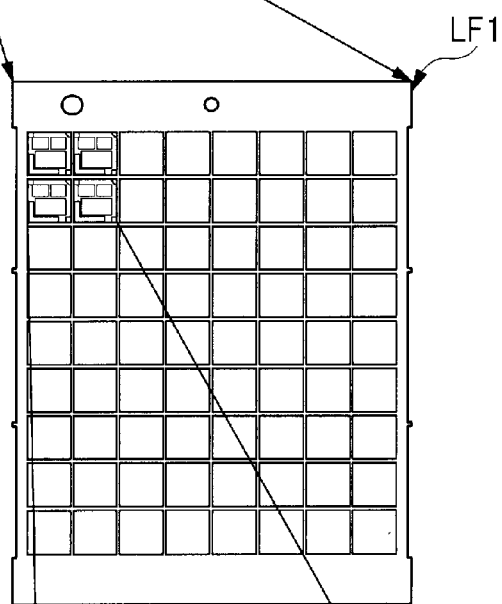
FIG. 8B is an enlarged view showing a part of the lead frame shown in FIG. 8A.
Figure 8C:
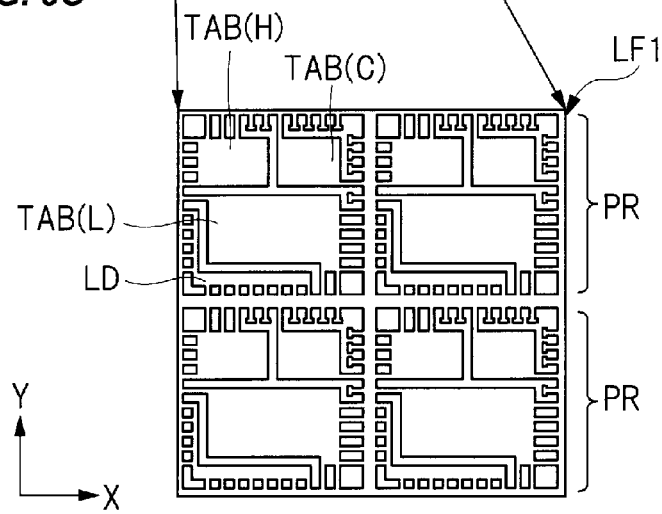
FIG. 8C is a further enlarged view showing a part of the lead frame shown in FIG. 8B.

First, as shown in FIGS. 8A to 8C, a lead frame LF1 is provided (S101 in FIG. 5). FIG. 8A schematically shows an entire configuration of the lead frame LF1, and FIG. 8B shows an enlarged part of the lead frame LF1 shown in FIG. 8A. Furthermore, FIG. 8C shows a further enlarged part of the lead frame LF1 shown in FIG. 8B.

As shown in FIG. 8C, in the lead frame LF1 according to the present First Embodiment, there are arranged, in a matrix form (X direction and Y direction), a plurality of product regions PR, each of which includes the chip mounting portion TAB(C), the chip mounting portion TAB(H), the chip mounting portion TAB(L), and the leads LD.

Figure 9A:
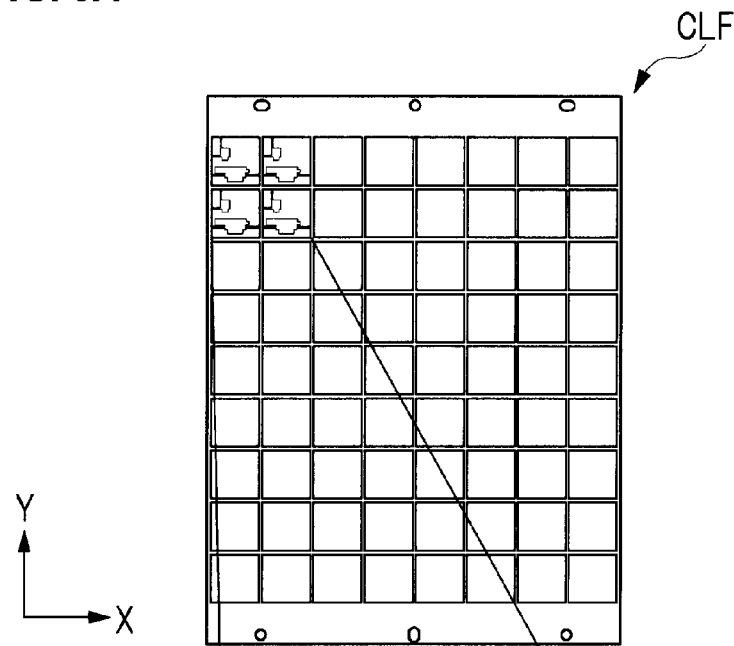
FIG. 9A is a diagram schematically showing an entire configuration of a clip frame and FIG. 9B is an enlarged view showing a part of the clip frame.
Figure 9B:
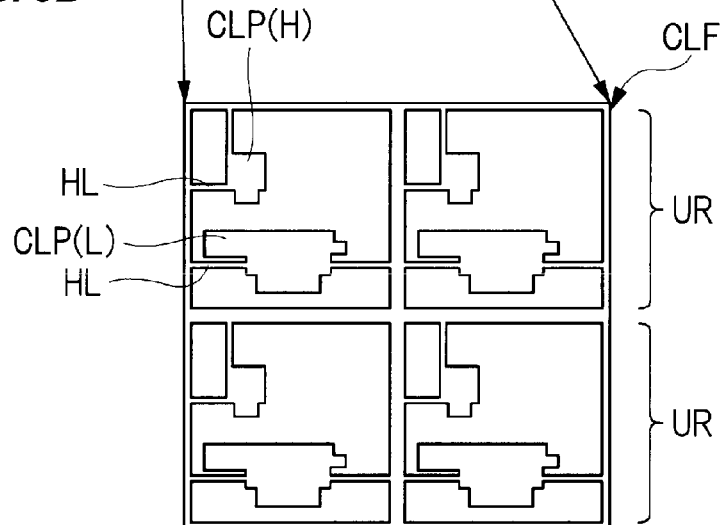
Figure 12:
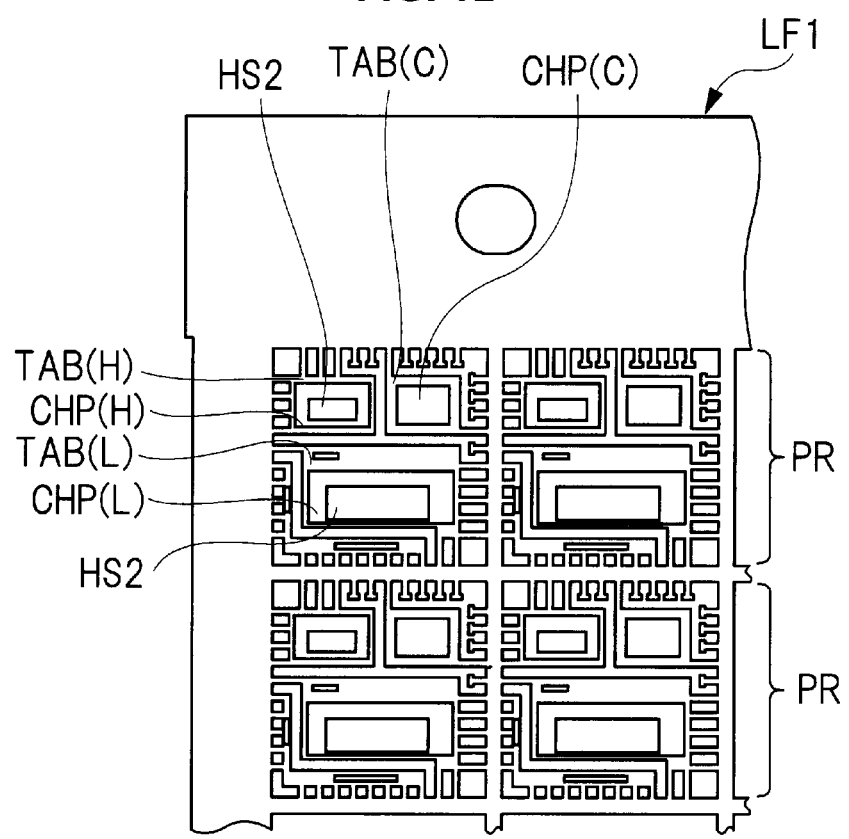
FIG. 12 is a plan view showing a manufacturing process of the semiconductor device following the process of FIG. 11.

Furthermore, in the present First Embodiment, a clip frame CLF as shown in FIGS. 9A and 9B is provided. A feature of the present First Embodiment is that the clip frame CLF is used. FIG. 9A schematically shows an entire configuration of the clip frame CLF. FIG. 9B shows an enlarged part of the clip frame CLF shown in FIG. 9A. As shown in FIG. 9B, the clip frame CLF includes a plurality of unit regions UR, each of which includes the High-MOS clip CLP(H) and the Low-MOS clip CLP(L), and the unit regions UR are arranged in a matrix form. Here, the High-MOS clip CLP(H) and the Low-MOS clip CLP(L) include, for example, metal plate containing copper as a material.

Hereinafter, a detailed configuration of the clip frame CLF shown in FIGS. 9A and 9B will be described. For example, as shown in FIG. 9B, the High-MOS clip CLP(H) and the Low-MOS clip CLP(L) are formed in each of the unit regions UR arranged in a matrix form, and the High-MOS clip CLP(H) and the Low-MOS clip CLP(L) are coupled to a frame body of the clip frame CLF by the support leads HL. Therefore, a plurality of High-MOS clips CLP(H) and a plurality of Low-MOS clips CLP(L) are integrally formed in the entire clip frame CLF.

In the clip frame CLF according to the present First Embodiment, as shown in FIGS. 9A and 9B, a plurality of unit regions UR is arranged to be aligned in the X direction and in the Y direction. That is, in the clip frame CLF according to the present First Embodiment, the unit regions UR are formed in a matrix form along the X direction and the Y direction. For example, in the clip frame CLF according to the present First Embodiment, the unit regions UR are arranged in the X direction at a first predetermined interval (first pitch) and arranged in the Y direction at a second predetermined interval (second pitch).

Here, by focusing attention on the lead frame LF1 shown in FIGS. 8A to 8C, for example, as shown in FIG. 8C, the product regions PR formed in the lead frame LF1 are arranged to be aligned in the X direction and in the Y direction. That is, in the lead frame LF1 shown in FIGS. 8A to 8C, the product regions PR are formed in a matrix form along the X direction and the Y direction. For example, in the lead frame LF1, the product regions PR are arranged in the X direction at the first predetermined interval (first pitch) and arranged in the Y direction at the second predetermined interval (second pitch).

Namely, in the present First Embodiment, the arrangement pitch in the X direction of the product regions PR formed in the lead frame LF1 and the arrangement pitch in the X direction of the unit regions UR formed in the clip frame CLF are the same. In addition, the arrangement pitch in the Y direction of the product regions PR formed in the lead frame LF1 and the arrangement pitch in the Y direction of the unit regions UR formed in the clip frame CLF are the same.

Here, the arrangement pitches in the X direction (first direction) and the Y direction (second direction) perpendicular to the X direction of the High-MOS clips CLP(H) and the Low-MOS clips CLP(L) formed in the clip frame CLF are defined as a first pitch and a second pitch, respectively.

In this case, the arrangement pitches in the X direction and the Y direction of the chip mounting portions (chip mounting portions TAB(C), chip mounting portions TAB(H), and chip mounting portions TAB(L)) formed in the lead frame LF1 are also the first pitch and the second pitch, respectively.

As a result, in the present First Embodiment, it is possible to arrange each of the product regions PR formed in the lead frame LF1 and each of the unit regions UR formed in the clip frame CLF, so as to overlap each other as seen in a plan view. More specifically, for example, it is possible to arrange the chip mounting portions TAB(H) shown in FIG. 8C and the High-MOS clips CLP(H) shown in FIG. 9B, so as to overlap each other in a plan view, and it is possible to arrange the chip mounting portions TAB(L) shown in FIG. 8C and the Low-MOS clips CLP(L) shown in FIG. 9B, so as to overlap each other in a plan view.

Next, as shown in FIG. 10, in each of the product regions PR formed in the lead frame LF1, the high melting point solder (high melting point solder paste) HS1 is supplied onto the chip mounting portion TAB(C), the chip mounting portion TAB(H), and the chip mounting portion TAB(L) (S102 in FIG. 5). Specifically, for example, by using a solder printing method, the high melting point solder HS1 is printed onto the chip mounting portion TAB(C), the chip mounting portion TAB(H), and the chip mounting portion TAB(L).

The high melting point solder HS1 means a solder that does not melt even when heated to approximately 260° C., and for example, the high melting point solder HS1 can include a solder with a melting point of approximately 300° C. and a reflow temperature of approximately 350° C. and containing 90% by weight or more of Pb (lead).

Note that, here, a method for supplying the high melting point solder HS1 onto the chip mounting portion TAB(C), the chip mounting portion TAB(H), and the chip mounting portion TAB(L) is described, but the method is not limited to the method described above. For example, the high melting point solder HS1 contained in a syringe is provided and the high melting point solder HS1 may be applied onto the chip mounting portion TAB(C), the chip mounting portion TAB(H), and the chip mounting portion TAB(L), from an application nozzle attached to the tip of the syringe. However, when the solder printing method is used, the high melting point solder HS1 can be supplied to a plurality of positions at the same time, and thus it is possible to reduce the operation time of the process.

Subsequently, as shown in FIG. 11, in each of the product regions PR formed in the lead frame LF1, first, the driver IC chip CHP(C) is mounted (arranged) over the chip mounting portion TAB(C) (S103 in FIG. 5). Then, the High-MOS chip CHP(H) is mounted over the chip mounting portion TAB(H) (S104 in FIG. 5), and thereafter, the Low-MOS chip CHP(L) is mounted over the chip mounting portion TAB(L) (S105 in FIG. 5). The order of mounting the driver IC chip CHP(C), the High-MOS chip CHP(H), and the Low-MOS chip CHP(L) is not limited to the above, and the order may be arbitrarily changed.

Thereafter, the lead frame LF1 is set to a dedicated jig for fixing the position (S106 in FIG. 5). Specifically, as shown in FIG. 13, the lead frame LF1 is positioned by insertion of an opening OP1 formed in the lead frame LF1 to, for example, a positioning pin of the dedicated jig.

Figure 13:
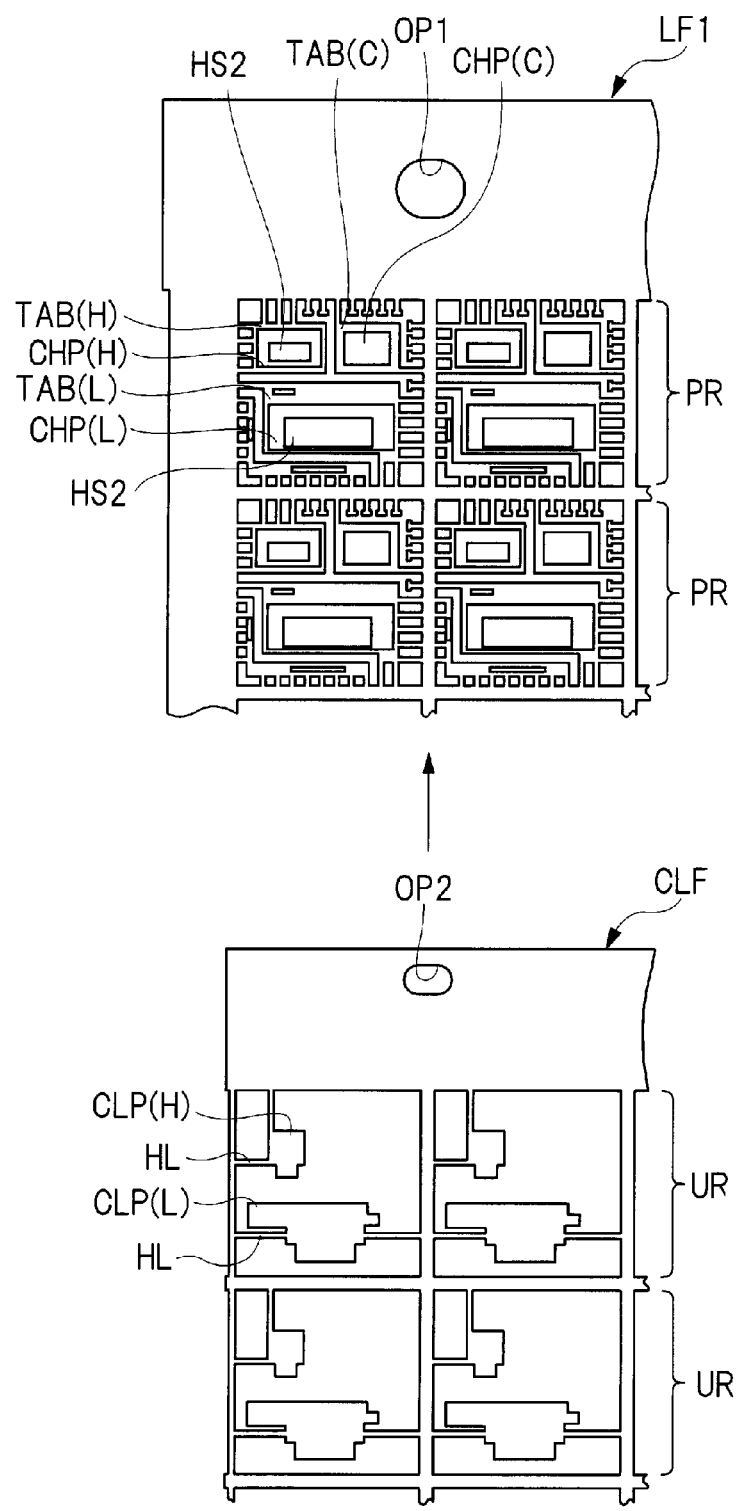
FIG. 13 is a plan view showing a manufacturing process of the semiconductor device following the process of FIG. 12.

Next, as shown in FIG. 13, in each of the product regions PR formed in the lead frame LF1, the high melting point solder (high melting point solder paste) HS2 is supplied onto the High-MOS chip CHP(H) (S107 in FIG. 5). Thereafter, the high melting point solder HS2 is supplied onto the Low-MOS chip CHP(L) (S108 in FIG. 5). Specifically, the high melting point solder HS2 is supplied onto a source electrode pad (High-MOS pad) (not shown in the drawings) formed on the High-MOS chip CHP(H) and the high melting point solder HS2 is supplied onto a source electrode pad (Low-MOS pad) (not shown in the drawings) formed on the Low-MOS chip CHP(L). Furthermore, as shown in FIG. 13, the high melting point solder HS2 is supplied onto a partial region of the chip mounting portion TAB(L) and a partial region of the lead.

Specifically, for example, by using an application method, the high melting point solder HS2 is applied to the High-MOS chip CHP(H), the Low-MOS chip CHP(L), a partial region of the chip mounting portion TAB(L), and a partial region of the lead. The high melting point solder HS2 formed at this time may include the same material as that of the high melting point solder HS1 described above or may include a different material.

Thereafter, as shown in FIG. 13, the clip frame CLF is set to a dedicated jig for fixing the position (S109 in FIG. 5). Specifically, as shown in FIG. 13, an opening OP2 formed in the clip frame CLF is further inserted to the positioning pin to which the opening OP1 formed in the lead frame LF1 is inserted. Thereby, according to the present First Embodiment, it is possible to arrange the clip frame CLF over the lead frame LF1 so that the clip frame CLF may overlap the lead frame LF1. This is one of the feature points of the present First Embodiment. Specifically, as described above, it is possible to overlap each of the product regions PR formed in the lead frame LF1 with each of the unit regions UR formed in the clip frame CLF in a plan view, by insertion of the opening OP1 formed in the lead frame LF1 and the opening OP2 formed in the clip frame CLF to the positioning pin provided on the dedicated jig.

That is, in the present First Embodiment, the arrangement pitch in the X direction of the product regions formed in the lead frame LF1 and the arrangement pitch in the X direction of the unit regions formed in the clip frame CLF are the same. In addition, the arrangement pitch in the Y direction of the product regions formed in the lead frame LF1 and the arrangement pitch in the Y direction of the unit regions formed in the clip frame CLF are the same.

As a result, in the present First Embodiment, it is possible to arrange each of the product regions PR formed in the lead frame LF1 and each of the unit regions UR formed in the clip frame CLF so as to overlap each other as seen in a plan view. More specifically, for example, it is possible to arrange the High-MOS chips CHP(H) shown in FIG. 13 and the High-MOS clips CLP(H) shown in FIG. 13 so as to overlap each other in a plan view and it is possible to arrange the Low-MOS chips CHP(L) shown in FIG. 13 and the Low-MOS clips CLP(L) to overlap each other in a plan view.

As described above, according to the present First Embodiment, it is possible to overlap each of the product regions PR with each of the unit regions UR in a plan view, by only overlapping the clip frame CLF with the lead frame LF1. This means that the High-MOS clips CLP(H) formed in each of the unit regions UR can be mounted over the High-MOS chips CHP(H) formed in each of the product regions PR at the same time. In the same way, this means that the Low-MOS clips CLP(L) formed in each of the unit regions UR can be mounted, at a time, over the Low-MOS chips CHP(L) formed in each of the product regions PR. As a result, according to the present First Embodiment, it is possible to simplify the manufacturing process compared with a case where the High-MOS clips CLP(H) and the Low-MOS clips CLP(L) are separately (individually) mounted over the High-MOS chips CHP(H) and the Low-MOS chips CHP(L) respectively. Thereby, according to the present First Embodiment, it is possible to reduce the manufacturing cost of the semiconductor device PK1.

Subsequently, a reflow is performed on the high melting point solders (the high melting point solder HS1 and the high melting point solder HS2) (S110 in FIG. 6). Specifically, the lead frame LF1 including the high melting point solders is heated at a temperature of, for example, approximately 350° C. (first temperature). Thereby, the high melting point solders are melted, and thus the rear surface (drain electrode) of the High-MOS chip CHP(H) and the chip mounting portion TAB (H) are electrically coupled and the rear surface (drain electrode) of the Low-MOS chip CHP(L) and the chip mounting portion TAB(L) are electrically coupled. Furthermore, the High-MOS clip CLP(H), the source electrode pad on the surface of the High-MOS chip CHP(H), and the chip mounting portion TAB(L) are electrically coupled and the Low-MOS clip CLP(L), the source electrode pad on the surface of the Low-MOS chip CHP(L), and a lead to which a reference potential is supplied are electrically coupled.

Note that here, the chips and the clips are coupled by one reflow process in S110 shown in FIG. 6, but the reflow process may be divided into a plurality of reflow processes. That is, the first reflow may be performed after the chips are mounted and the second reflow may be performed after the clips are mounted. However, when the reflow is performed after the chips are mounted and continuously the clips are mounted, only one reflow process is required, and thus the process can be reduced.

Subsequently, flux cleaning is performed for removal of flux included in the high melting point solders (S111 in FIG. 6). Then, the surface of the lead frame LF1 is cleaned by performing plasma processing on the surface of the lead frame LF1 from the viewpoint of enhancing the bonding characteristics of wires in a wire bonding process performed later (S112 in FIG. 6).

The plasma processing in S112 shown in FIG. 6 is not essential. In the flux cleaning process in S111 shown in FIG. 6, in the case where the surface of the lead frame LF1 can be cleaned to the extent that there will be no problem in the wire bonding process performed later, the plasma processing process can be omitted.

Figure 14B:
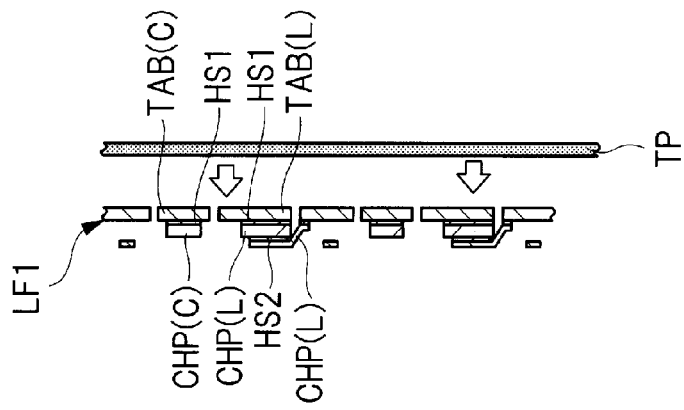
FIGS. 14A and 14B are diagrams showing a manufacturing process of the semiconductor device following the process of FIG. 13.
Figure 14A:
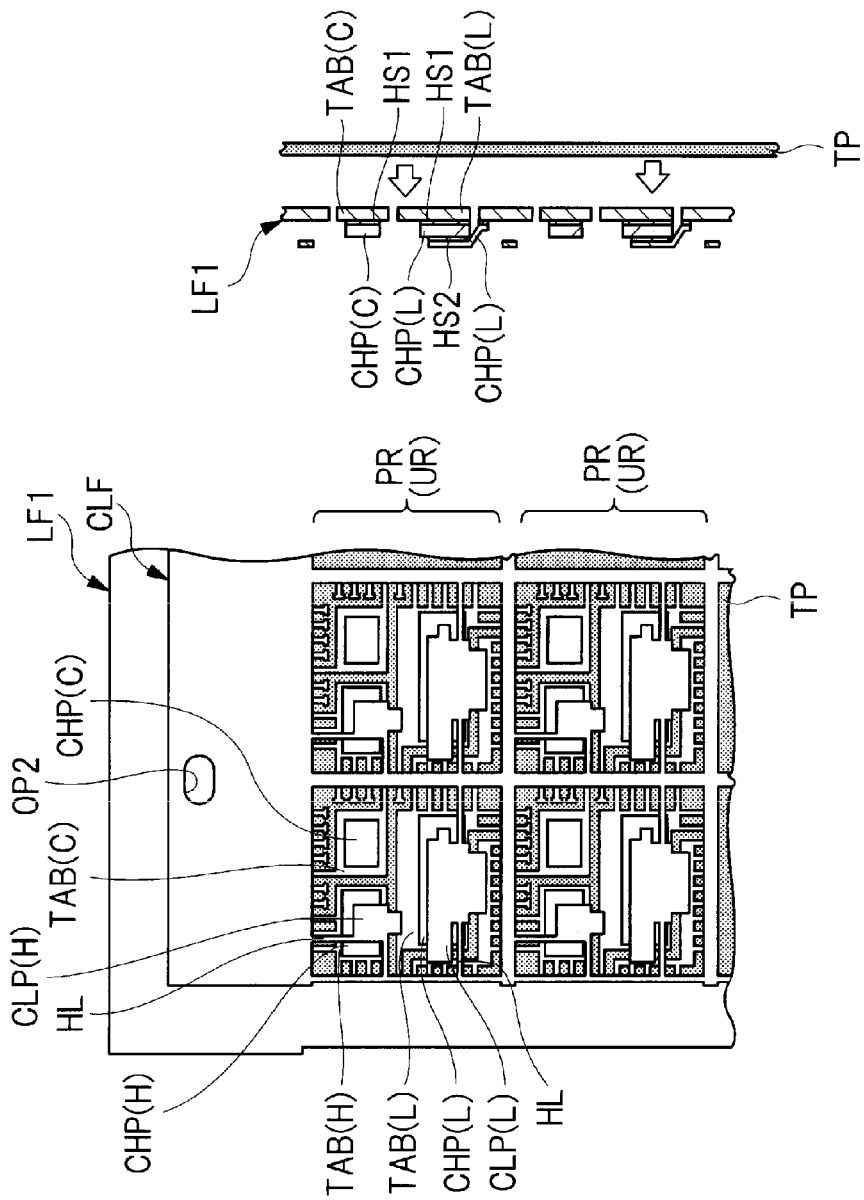

Next, as shown in FIGS. 14A and 14B, tape TP is attached to the rear surface of the lead frame LF1 (S113 in FIG. 6). That is, the tape TP is attached to a surface of the lead frame LF1 opposite to the surface where the driver IC chip CHP(C), the High-MOS chip CHP(H), and the Low-MOS chip CHP (L) are mounted. An example of the tape TP is tape whose base material is polyimide resin and which includes an adhesive portion. At this time, as described above, the heating process (reflow) of approximately 350° C. on the high melting point solders is completed in a process before the process for attaching the tape TP. Therefore, the heat resistance property of the adhesive portion of the tape TP will not be a problem in the present First Embodiment.

Figure 15A:
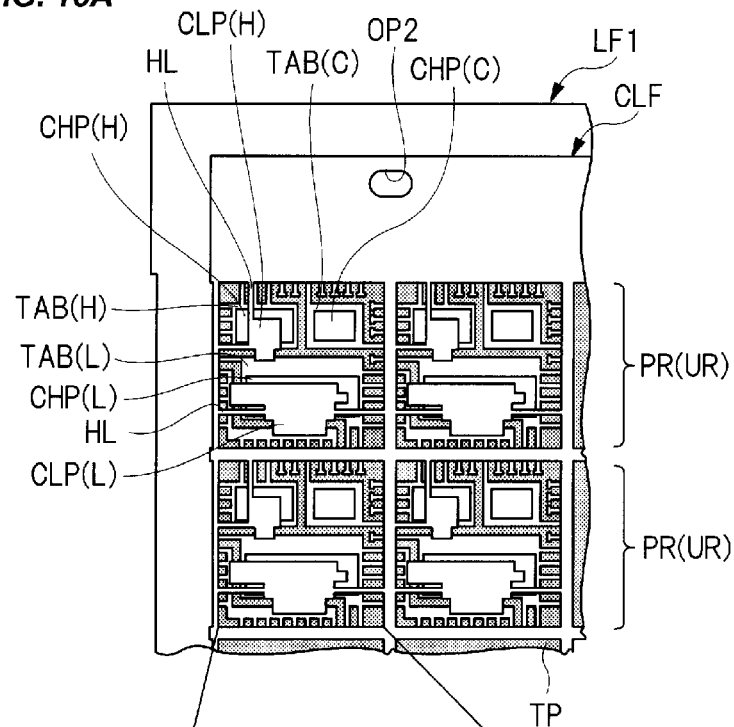
FIGS. 15A and 15B show a manufacturing process of the semiconductor device following the process of FIGS. 14A and 14B.
Figure 15B:
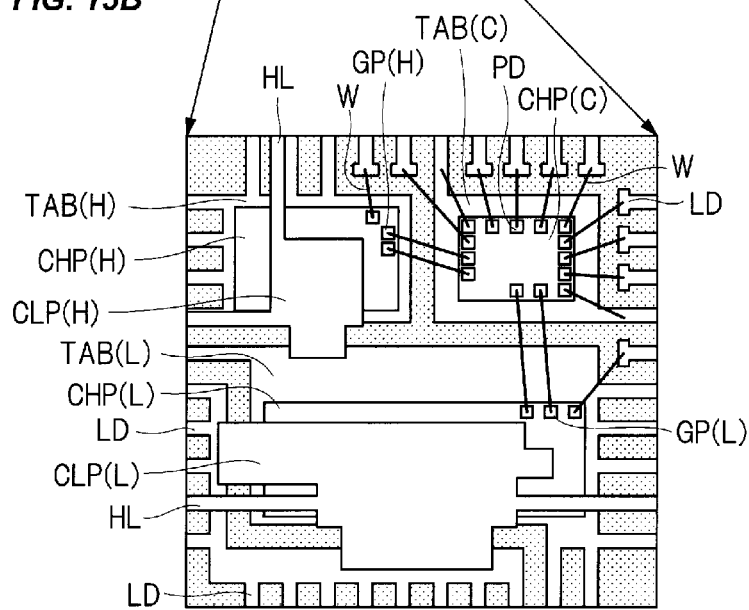

Subsequently, as shown in FIGS. 15A and 15B, a wire bonding process is performed (S114 in FIG. 6). FIG. 15A is a diagram showing the lead frame LF1 when the wire bonding process is performed after the tape TP is attached to the rear surface of the lead frame LF1. However, in FIG. 15A, elements (wires) formed by performing the actual wire bonding process are omitted and the elements (wires) are shown in FIG. 15B which is an enlarged diagram of one product region PR shown in FIG. 15A.

In FIG. 15B, it is known that a plurality of electrode pads PD formed on the driver IC chip CHP(C) and a plurality of leads LD are coupled by a plurality of wires W. Furthermore, as shown in FIG. 15B, the gate electrode pad GP(H) formed on the High-MOS chip CHP(H) and the electrode pad PD formed on the driver IC chip CHP(C) are coupled by the wire W. In the same way, the gate electrode pad GP(L) formed on the Low-MOS chip CHP(L) and the electrode pad PD formed on the driver IC chip CHP(C) are coupled by the wire W. Thereby, according to the present First Embodiment, it is known that the High-MOS transistor QH formed in the High-MOS chip CHP(H) (see FIG. 1) and the Low-MOS transistor QL formed in the Low-MOS chip CHP(L) (see FIG. 1) are electrically controlled by the control circuit CC formed in the driver IC chip CHP(C) (see FIG. 1).

Here, according to the present First Embodiment, the tape TP is attached to the rear surface of the lead frame LF1 in a process before the wire bonding process is performed. Therefore, according to the present First Embodiment, it is possible to easily vacuum-hold the lead frame LF1 to which the tape TP is attached. As a result, it is possible to perform the wire bonding process while reliably fixing the lead frame LF1 by the vacuum holding even when the lead frame LF1 is a lead frame for MAP mold technique (batch mold technique). As a result, according to the present First Embodiment, it is possible to enhance reliability of the wire bonding process.

Note that the wire bonding process is performed in a state in which the lead frame LF1 is heated to approximately 200° C. to approximately 250° C. for stabilization of joint of the wires W. However, the heat resistance property of the tape TP attached to the rear surface of the lead frame LF1 is approximately 250° C., and thus it is considered that no problem occurs in the heat resistance property of the adhesive portion of the tape TP due to the heating process applied in the wire bonding process.

Next, as shown in FIG. 16, the product regions formed in the lead frame LF1 are collectively sealed (molded) by the resin MR (S115 in FIG. 6). In other words, the product regions PR in the lead frame LF1 are collectively sealed by the resin MR so that the resin MR covers the driver IC chip CHP(C), the High-MOS chip CHP(H) and the Low-MOS chip CHP(L), which are shown in FIG. 15B, and thus a sealing body is formed. That is, in the present First Embodiment, as a technique for sealing a semiconductor chip by a resin, there is used a so-called MAP mold technique in which the product regions PR are included in a cavity and the product regions PR are collectively sealed by a resin. According to the MAP mold technique, it is not necessary to provide a path for injecting a resin for each product region PR, and thus the product regions can be densely arranged. Thereby, according to the MAP mold technique, the number of products to be acquired can be increased, and thus it is possible to reduce the cost of the product.

At this time, in the present First Embodiment, the adhesive tape TP is attached to the rear surface of the lead frame LF1 in a process before the resin sealing process (mold process) by the MAP mold technique. Therefore, according to the present First Embodiment, for example, as shown in FIG. 17, it is possible to reliably attach the tape TP to rear surface terminals (leads) formed on the rear surface of the lead frame LF1. As a result, in the resin sealing process using the MAP mold technique, no gap is formed between the rear surface terminals and the tape TP, and thus it is possible to sufficiently suppress resin leakage (resin burrs) to the rear side of the rear surface terminals.

Note that the resin used in the resin sealing process is, for example, a thermosetting resin. Therefore, the resin sealing process is performed in a state in which the thermosetting resin is heated in a range of approximately 160° C. to approximately 200° C. in order to cure the thermosetting resin. However, the heat resistance property of the tape TP attached to the rear surface of the lead frame LF1 is approximately 250° C., and thus it is considered that no problem occurs in the heat resistance property of the adhesive portion of the tape TP due to the heating process applied in the resin sealing process.

After that, the tape TP attached to the rear surface of the lead frame LF1 is peeled off from the lead frame LF1 (S116 in FIG. 6). Then, a plating film is formed on the surfaces of the chip mounting portion TAB(C), the chip mounting portion TAB(H), the chip mounting portion TAB(L), and the rear surface terminals BTE (see FIG. 3), which are exposed from the rear surface of the resin MR (sealing body) (S117 in FIG. 6). Furthermore, a mark is formed on the surface of the sealing body including the resin MR (marking process) (S118 in FIG. 6).

Figure 18A:
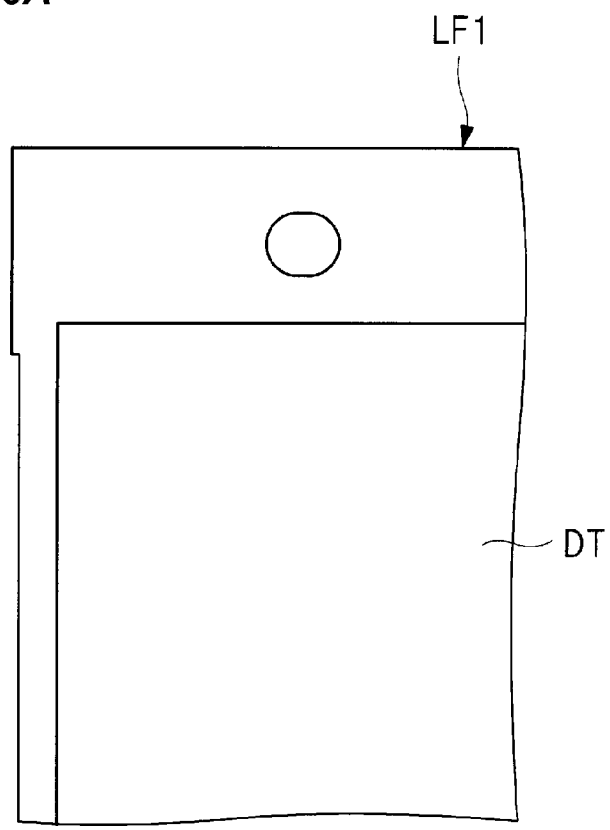
FIGS. 18A and 18B show a manufacturing process of the semiconductor device following the process of FIGS. 16 and 17.
Figure 18B:
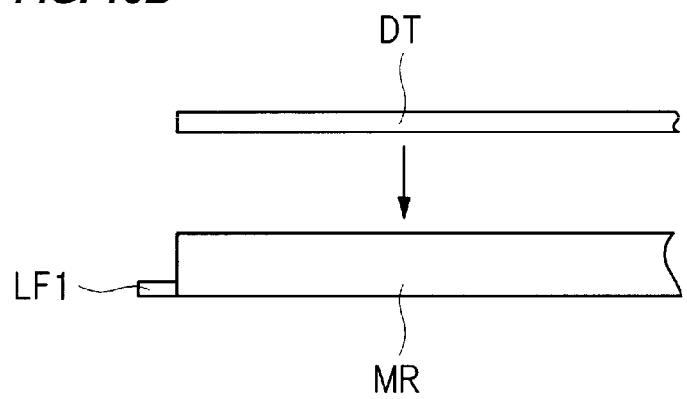
Figure 19A:
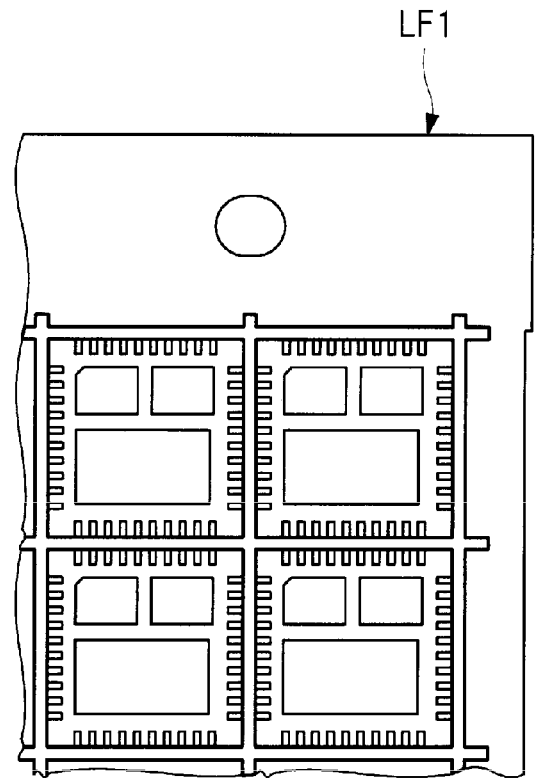
FIGS. 19A to 19C show a manufacturing process of the semiconductor device following the process of FIGS. 18A and 18B.
Figure 19B:
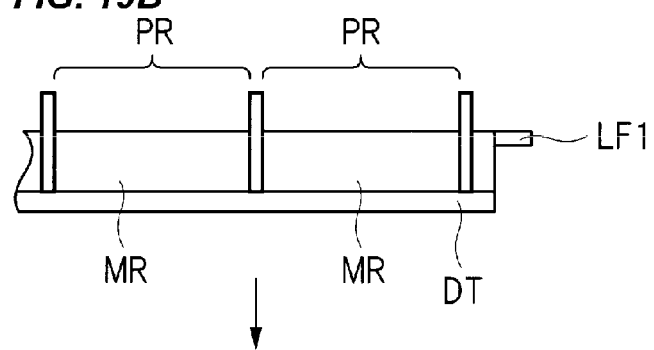
Figure 19C:
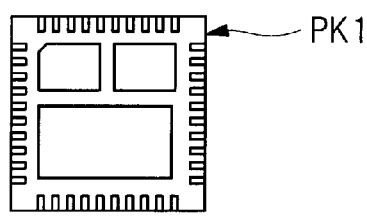

Subsequently, as shown in FIGS. 18A and 18B, dicing tape DT is attached to the surface of the sealing body including the resin MR (S119 in FIG. 7). Then, as shown in FIGS. 19A and 19B, the sealing body including the resin MR is cut off for each product region PR (package dicing) (S120 in FIG. 7). Specifically, partitioning regions (boundary regions) that partition the product regions PR formed in the lead frame LF1, are cut off by a dicing blade, and thus the product regions PR are divided into individual chips. Thereby, for example, it is possible to acquire the semiconductor device PK1 according to the present First Embodiment as shown in FIG. 19C. At this time, the support leads HL formed in the clip frame CLF are cut off. As a result, for example, as shown in FIG. 2, cross-sections of the support leads HL are exposed from the side surfaces of the semiconductor device PK1.

Thereafter, each semiconductor device PK1 separated into an individual chip is screened by an electric test (S121 in FIG. 7) and the semiconductor devices PK1 that are determined to be non-defective are packed and shipped (S122 in FIG. 7). In this way, the semiconductor device according to the present First Embodiment can be manufactured.

[Characteristics of the Present First Embodiment]

Next, the feature points of the manufacturing method of the semiconductor device PK1 according to the present First Embodiment will be described. The feature points of the manufacturing method of the semiconductor device PK1 according to the present First Embodiment are included in the processes from step S106 to step S110, shown in FIG. 5. Hereinafter, the details of these processes will be described with reference to the drawings.

Figure 20:
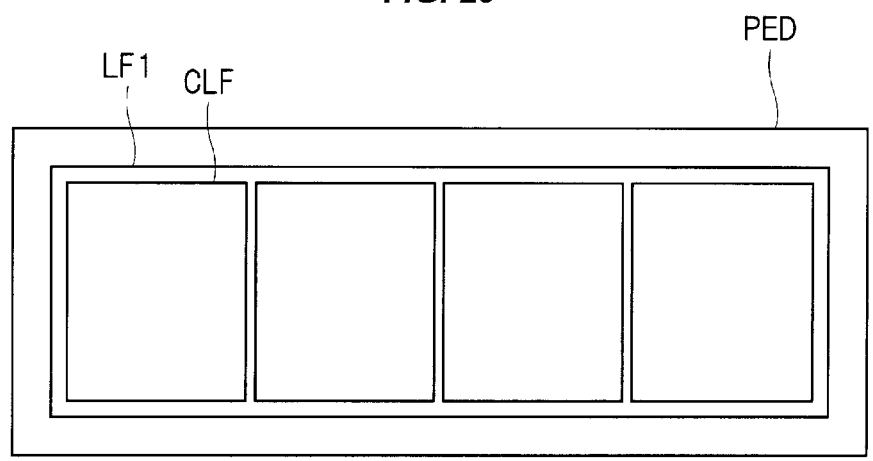
FIG. 20 is a schematic diagram showing a state in which a lead frame and clip frames are set in a dedicated jig.

FIG. 20 is a schematic diagram showing a state in which the lead frame LF1 and the clip frames CLF are set in a dedicated jig by performing the processes from step S106 to step S109. As shown in FIG. 20, the lead frame LF1 is arranged over the jig PED and the clip frames CLF are arranged over the lead frame LF1.

Figure 21:
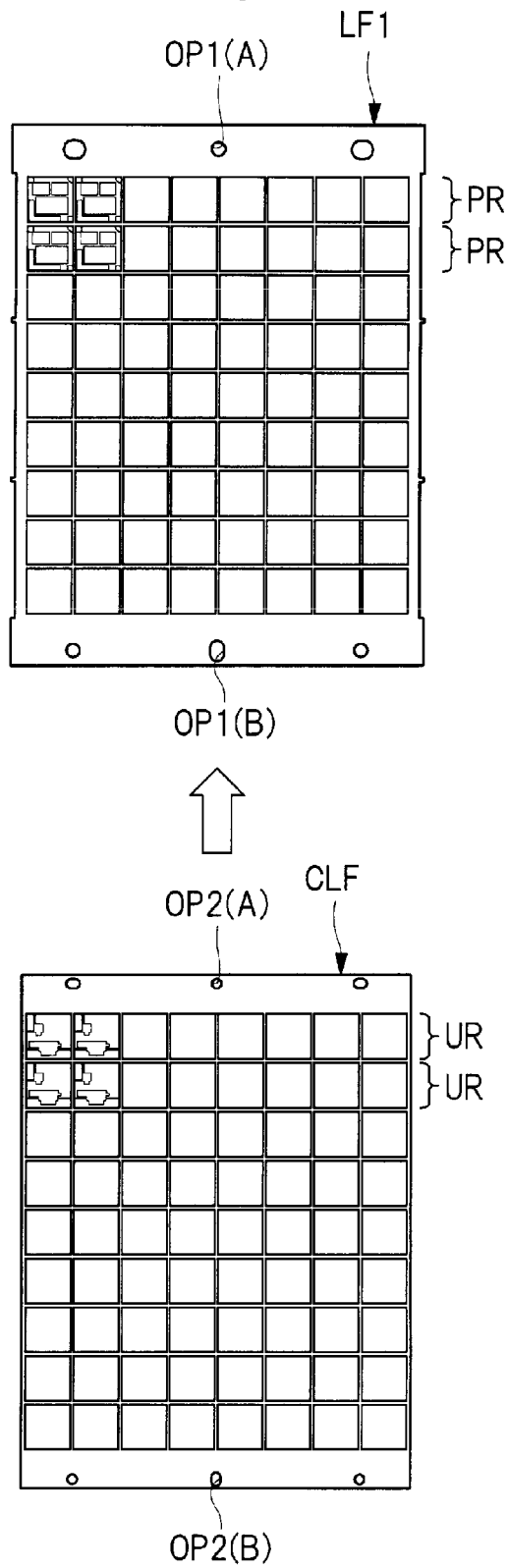
FIG. 21 is a diagram showing a situation in which the clip frame is mounted over the lead frame.

Specifically, FIG. 21 is a diagram showing a situation in which the clip frame CLF is mounted over the lead frame LF1. As shown in FIG. 21, an opening OP1(A) and an opening OP1(B) are formed in the lead frame LF1. The lead frame LF1 can be fixed at a predetermined position by insertion of positioning pins (not shown) provided on the jig into the opening OP1(A) and the opening OP1(B).

At this time, as shown in FIG. 21, the shape of the opening OP1(A) and the shape of the opening OP1(B) are different from each other. For example, the opening OP1(A) has a circular shape and the opening OP1(B) has an elongated hole shape. In this case, a gap is formed between the opening OP1(B) having an elongated hole shape and the positioning pin inserted in the opening OP1(B). Therefore, for example, when a heating process is applied to the lead frame LF1, even if the lead frame LF1 formed mainly of copper (CU), a copper alloy, a 42 alloy, or the like expands, the deformation of the lead frame LF1 is suppressed by the gap. That is, the reason why the shapes of the opening OP1(A) and the opening OP1(B) are different from each other is because there is suppressed the deformation caused when the heating process is applied to the lead frame LF1.

As shown in FIG. 21, an opening OP2(A) and an opening OP2(B) are formed in the clip frame CLF, and the clip frame CLF can be fixed at a predetermined position by insertion of the positioning pins (not shown) provided on the jig into the opening OP2(A) and the opening OP2(B).

Also in this case, as shown in FIG. 21, the shape of the opening OP2(A) and the shape of the opening OP2(B) are different from each other. For example, the opening OP2(A) has a circular shape and the opening OP2(B) has an elongated hole shape. The reason why the shapes of the opening OP2(A) and the opening OP2(B) are different from each other is also because there is suppressed the deformation caused when the heating process is applied to the clip frame CLF.

Figure 22:
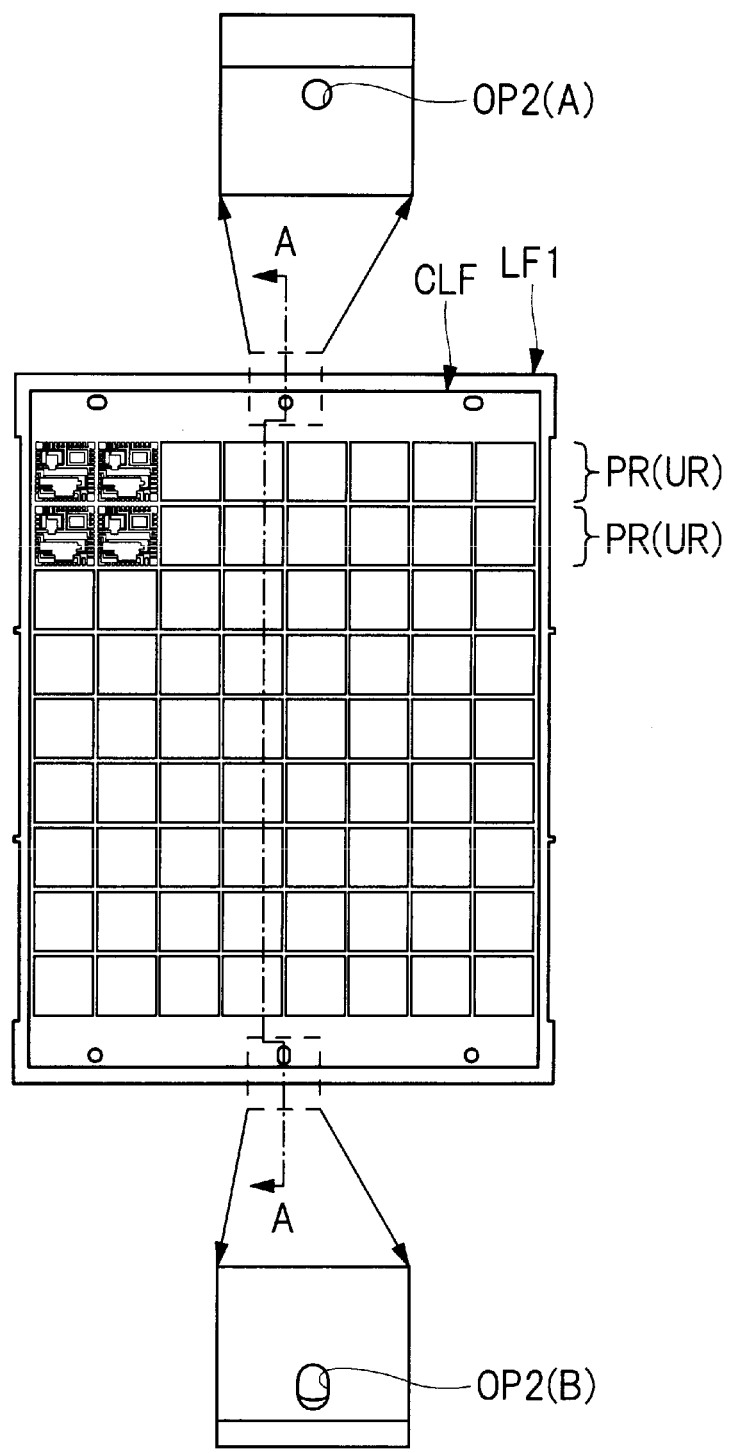
FIG. 22 is a diagram showing a state in which the lead frame and the clip frame are overlapped.

In this way, in the present First Embodiment, the lead frame LF1 and the clip frame CLF are fixed by the same positioning pins. FIG. 22 is a diagram showing a state in which the lead frame LF1 and the clip frame CLF are overlapped. As shown in FIG. 22, in the present First Embodiment, the positioning pins are inserted in the opening OP1(A) and the opening OP1(B) formed in the lead frame LF1 and also the positioning pins are inserted in the opening OP2(A) and the opening OP2(B) formed in the clip frame CLF. In addition, in the present First Embodiment, the size and the arrangement interval of each of the product regions PR formed in the lead frame LF1 are the same as those of each of the unit regions UR formed in the clip frame CLF. Thereby, according to the present First Embodiment, it is possible to arrange each of the product regions PR formed in the lead frame LF1 and each of the unit regions UR formed in the clip frame CLF to overlap each other as seen in a plan view.

Figure 23:
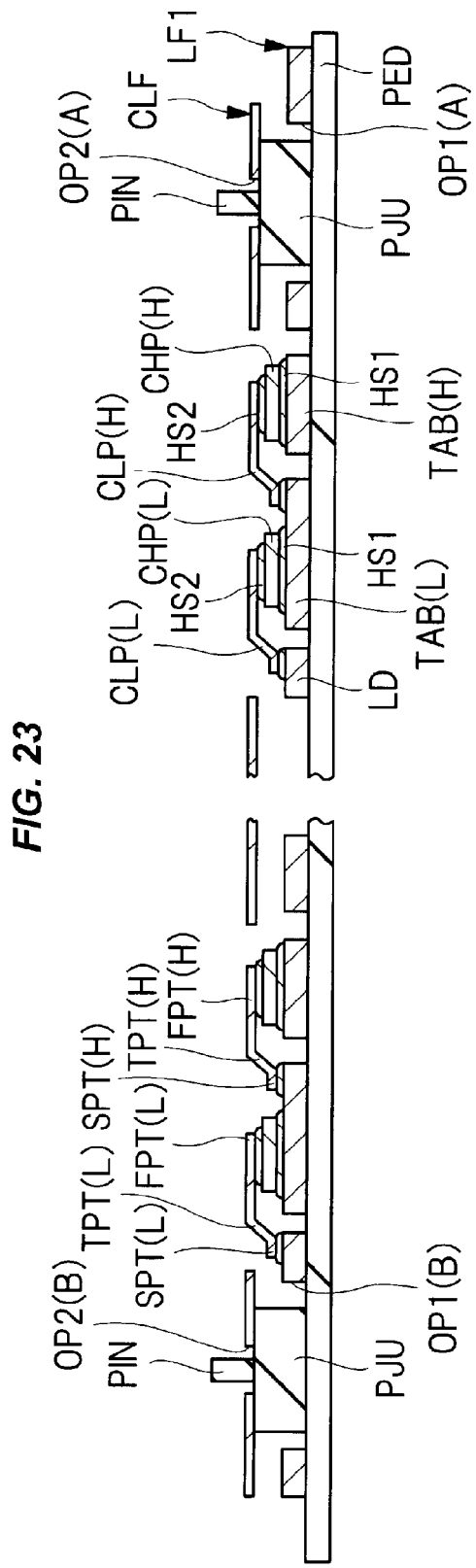
FIG. 23 is a cross-sectional view taken along A-A line in FIG. 22.

Next, FIG. 23 is a cross-sectional view taken along A-A line in FIG. 22. As shown in FIG. 23, the lead frame LF1 is arranged over the jig PED. The opening OP1(A) and the opening OP1(B) are formed in the lead frame LF1 and protruding portions PJU are inserted in the opening OP1(A) and the opening OP1(B). That is, in the present First Embodiment, a plurality of protruding portions PJU is provided on the jig PED, and the opening OP1(A) and the opening OP1(B) formed in the lead frame LF1 are inserted to the protruding portions PJU. Therefore, the size (diameter) of the opening OP1(A) and the size (diameter) of the opening OP1(B) are greater than the size (diameter) of the protruding portions PJU.

In addition, the chip mounting portion TAB(H) and the chip mounting portion TAB(L) are formed in the lead frame LF1 and the High-MOS chip CHP(H) is formed over the chip mounting portion TAB(H) via the high melting point solder HS1. In contrast, the Low-MOS chip CHP(L) is formed over the chip mounting portion TAB(L) via the high melting point solder HS1.

Furthermore, in the present First Embodiment, the clip frame CLF is arranged over the protruding portions PJU provided on the jig PED. Specifically, the opening OP2(A) and the opening OP2(B) are formed in the clip frame CLF and the positioning pins PIN provided over the protruding portions PJU are inserted in the opening OP2(A) and the opening OP2(B). That is, in the present First Embodiment, the protruding portions PJU are provided on the jig PED and the positioning pins PIN are provided over the protruding portions PJU. In addition, the clip frame CLF is fixed by insertion of the positioning pins PIN into the opening OP2(A) and the opening OP2(B) provided in the clip frame CLF.

Because of the above, in the present First Embodiment, the size (diameter) of the protruding portions PJU provided over the jig PED is greater than the size (diameter) of the positioning pins PIN provided over the protruding portions PJU, and the size (diameter) of the opening OP1(A) provided in the lead frame LF1 and the size (diameter) of the opening OP1(B) provided in the lead frame LF1 are greater than the size (diameter) of the protruding portions PJU. In contrast, the size (diameter) of the opening OP2(A) provided in the clip frame CLF and the size (diameter) of the opening OP2(B) provided in the clip frame CLF are greater than the size (diameter) of the positioning pins PIN and smaller than the size (diameter) of the protruding portions PJU. As a result, the opening OP1(A) and the opening OP1(B) formed in the lead frame LF1 are inserted to the protruding portions PJU, and the lead frame LF1 is arranged over the jig PED while the lead frame LF1 is fixed by the protruding portions PJU.

In addition, the opening OP2(A) and the opening OP2(B) formed in the clip frame CLF are inserted to the positioning pins PIN, but not inserted to the protruding portions PJU. As a result, the clip frame CLF is inserted to the positioning pins PIN, and the clip frame CLF is arranged over the protruding portions PJU while being fixed to the positioning pins PIN. Thereby, the lead frame LF1 and the clip frame CLF are supported in a state in which there is a space corresponding to the thickness of the protruding portions PJU in the height direction between the lead frame LF1 and the clip frame CLF.

Here, as shown in FIG. 23, the High-MOS clip CLP(H) and the Low-MOS clip CLP(L) are formed in the clip frame CLF. The High-MOS clip CLP(H) is mounted over the High-MOS chip CHP(H) via the high melting point solder HS2 and is also mounted over the chip mounting portion TAB(L) via the high melting point solder HS1. That is, the High-MOS clip CLP(H) is arranged so as to span from over the High-MOS chip CHP(H) to over the chip mounting portion TAB(L).

Specifically, as shown in FIG. 23, the High-MOS clip CLP(H) is configured to include a first portion FPT(H) coupled to the electrode pad of the High-MOS chip CHP(H), a second portion SPT (H) coupled to the chip mounting portion TAB(L), and a third portion TPT(H) connecting the first portion FPT(H) and the second portion SPT(H). In particular, the height position of the first portion FTP(H) is higher than that of the second portion SPT(H), and the first portion FPT(H) and the second portion SPT(H) are coupled by the bent third portion TPT(H).

In the same way, the Low-MOS clip CLP(L) is mounted over the Low-MOS chip CHP(L) via the high melting point solder HS2 and is also mounted over the lead LD via the high melting point solder HS1. That is, the Low-MOS clip CLP(L) is arranged so as to span from over the Low-MOS chip CHP (L) to over the lead LD.

Specifically, as shown in FIG. 23, the Low-MOS clip CLP (L) is configured to include a first portion FPT (L) coupled to the electrode pad of the Low-MOS chip CHP(L), a second portion SPT(L) coupled to the lead LD, and a third portion TPT(L) connecting the first portion FPT(L) and the second portion SPT(L). In particular, the height position of the first portion FTP(L) is higher than that of the second portion SPT(L), and the first portion FPT(L) and the second portion SPT(L) are coupled by the bent third portion TPT(L).

Figure 24:
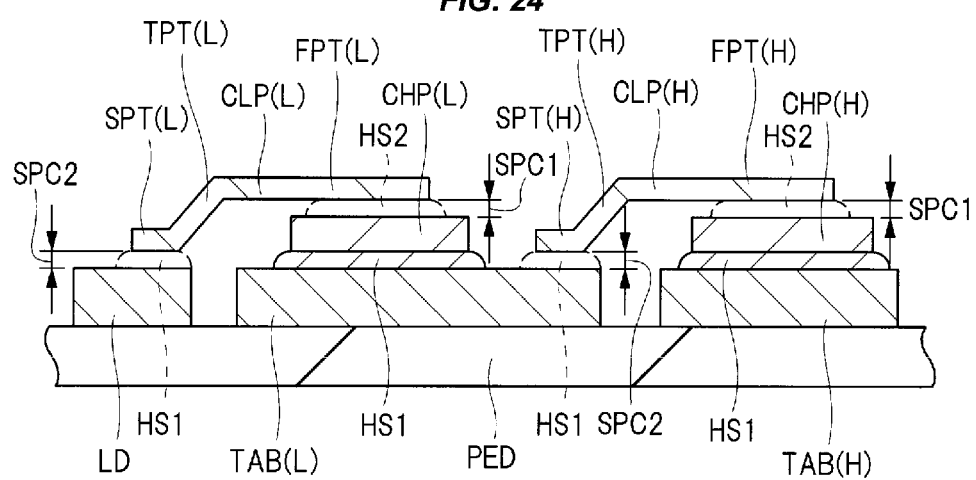
FIG. 24 is a partially enlarged cross-sectional view of FIG. 23.

As described above, in the present First Embodiment, the lead frame LF1 is arranged over the jig PED and the clip frame CLF is arranged over the protruding portions PJU provided over the jig PED. At this time, as shown in FIG. 23, the height of the protruding portions PJU is larger than a total thickness of the frame thickness of the lead frame LF1, the adhesive thickness of the high melting point solder HS1, and the chip thickness of the High-MOS chip CHP(H) (the chip thickness of the Low-MOS chip CHP(L)). That is, it is known that the interval (distance) between the lead frame LF1 and the clip frame CLF is greater than the total thickness of the frame thickness of the lead frame LF1, the adhesive thickness of the high melting point solder HS1, and the chip thickness of the High-MOS chip CHP(H) (the chip thickness of the Low-MOS chip CHP(L)). As a result, as shown in FIG. 24 which is a partially enlarged view of FIG. 23, in the present First Embodiment, there is a first space SPC1 between the upper surface of the High-MOS chip CHP(H) and the lower surface of the High-MOS clip CLP(H), and the first space SPC1 is filled with the high melting point solder HS2. In the same way, the first space SPC1 exists between the upper surface of the Low-MOS chip CHP(L) and the lower surface of the Low-MOS clip CLP(L), and the first space SPC1 is filled with the high melting point solder HS2.

Namely, in the present First Embodiment, as shown in FIG. 24, the first space SPC1 exists between the first portion FPT(H) of the High-MOS clip CLP(H) and the electrode pad of the High-MOS chip CHP(H), and the clip frame CLF is mounted over the lead frame LF1 so that the high melting point solder HS2 is in contact with the first portion FPT(H) of the High-MOS clip CLP(H) and the electrode pad of the High-MOS chip CHP(H) in the first space SPC1. Furthermore, the first space SPC1 exists between the first portion FPT(L) of the Low-MOS clip CLP(L) and the electrode pad of the Low-MOS chip CHP(L), and the clip frame CLF is mounted over the lead frame LF1 so that the high melting point solder HS2 is in contact with the first portion FPT(L) of the Low-MOS clip CLP(L) and the electrode pad of the Low-MOS chip CHP(L) in the first space SPC1.

In the present First Embodiment, in a state shown in FIGS. 23 and 24, the heating process (reflow) for heating the high melting point solder HS1 and the high melting point solder HS2 is performed. That is, in the present First Embodiment, the heating process (reflow) is performed in a state in which the lead frame LF1 is arranged over the jig PED and the clip frame CLF is arranged over the protruding portions PJU. This is a feature point of the manufacturing method of a semiconductor device according to the present First Embodiment. In this case, as shown in FIG. 24, in a state in which the first space SPC1 is formed between the High-MOS chip CHP(H) and the High-MOS clip CLP(H) and the first space SPC1 is formed between the Low-MOS chip CHP(L) and the Low-MOS clip CLP(L), the high melting point solders HS2 filling the first spaces SPC1 are melted.

At this time, in the present First Embodiment, the lead frame LF1 is arranged over the jig PED and the clip frame CLF is arranged over the protruding portions PJU, and thus even when the high melting point solder HS2 is melted in the first space SPC1 described above, the size (in particular, the height) of the first space SPC1 does not change and the first space SPC1 is maintained constant. This means that the size (in particular, the height) of the first space SPC1 is fixed even when the high melting point solder HS2 filling the first space SPC1 is melted. As a result, according to the present First Embodiment, it is possible to ensure the height of the high melting point solder HS2, by the height of the first space SPC1. In this way, according to the present First Embodiment, the thickness of the high melting point solder HS2 interposed between the High-MOS chip CHP(H) and the High-MOS clip CLP(H) can be ensured sufficiently, and thus it is possible to enhance the connection reliability between the High-MOS chip CHP(H) and the High-MOS clip CLP(H). In the same way, according to the present First Embodiment, a sufficient thickness of the high melting point solder HS2 interposed between the Low-MOS chip CHP(L) and the Low-MOS clip CLP(L) can be ensured, and thus it is possible to enhance the connection reliability between the Low-MOS chip CHP(L) and the Low-MOS clip CLP(L).

For example, attention is focused on the relationship between the High-MOS chip CHP(H) and the High-MOS clip CLP(H). In particular, there is considered the case where a plurality of High-MOS clips CLP(H) is individually mounted over the High-MOS chip CHP(H) instead of forming the High-MOS clips integrally with the clip frame CLF as in the present First Embodiment. In this case, none of the High-MOS clips CLP(H) is supported by anything.

In this state, when the high melting point solder HS2 is melted by the heating process (reflow), a pressure is applied to the melted high melting point solder HS2 by the weight of the High-MOS clip CLP(H) itself because the High-MOS clip CLP(H) individually mounted over the High-MOS chip CHP(H) is not supported by anything. As a result, for example, the inclination or the like of the High-MOS clip CLP(H) arranged over the melted high melting point solder HS2 may be caused, and thus the first space SPC1 may be deformed. Thereby, the first space SPC1 between the High-MOS chip CHP(H) and the High-MOS clip CLP(H) is narrowed, and thus it is considered that there may be caused a case where the thickness of the high melting point solder HS2 filling the first space SPC1 is not ensured. In this way, if the thickness of the high melting point solder HS2 is reduced, when the expansion and contraction of the high melting point solder HS2 is repeated due to the temperature cycle, a solder crack occurs in the high melting point solder HS2. As a result, the connection resistance between the High-MOS chip CHP(H) and the High-MOS clip CLP(H) rises, and thus the electrical characteristics of the semiconductor device degrade.

On this point, as a means to ensure the thickness of the high melting point solder HS2, for example, it is considered that protrusions are provided on the rear surface (lower surface) of the High-MOS clip CLP(H) and the protrusions are pressed to the High-MOS chip CHP(H), and thus the thickness of the high melting point solder HS2 interposed between the High-MOS chip CHP(H) and the High-MOS clip CLP(H) is ensured.

However, along with the downsizing of semiconductor devices, the sizes of the High-MOS chip CHP(H) and the High-MOS clip CLP(H) also become smaller, and thus it is becoming difficult to form protrusions on the small High-MOS clip CLP(H) and there is a risk that the number of protrusions formed on the High-MOS clip CLP(H) cannot be ensured sufficiently. As a result, if the downsizing of semiconductor devices is advanced from now on, it becomes difficult to sufficiently and stably ensure the thickness of the high melting point solder HS2 interposed between the High-MOS chip CHP(H) and the High-MOS clip CLP(H), in the structure in which protrusions are provided on the rear surface (lower surface) of the High-MOS clip CLP(H).

Therefore, there is desired a technique capable of ensuring the thickness of the high melting point solder HS2 interposed between the High-MOS chip CHP(H) and the High-MOS clip CLP(H) without providing protrusions on the High-MOS clip CLP(H), and the technical idea of the present First Embodiment responds to this desire.

Namely, in the present First Embodiment, the High-MOS clip CLP(H) is formed in the clip frame CLF and the High-MOS clip CLP(H) is supported by the clip frame CLF. In addition, in the present First Embodiment, the lead frame LF1 is arranged over the jig PED and the clip frame CLF is arranged over the protruding portions PJU. Therefore, as to the first space SPC1 between the High-MOS chip CHP(H) and the High-MOS clip CLP(H), even when the high melting point solder HS2 is melted, the size (in particular, the height) of the first space SPC1 does not change and the first space SPC1 is maintained. This is because the High-MOS clip CLP(H) is supported by the clip frame CLF and the support from the clip frame CLF is maintained also at the time of the heating process (reflow).

Therefore, according to the present First Embodiment, even when the high melting point solder HS2 filling the first space SPC1 is melted, the thickness of the high melting point solder HS2 can be ensured by the height of the first space SPC1 because the size (in particular, the height) of the first space SPC1 is fixed. In this way, according to the present First Embodiment, the thickness of the high melting point solder HS2 interposed between the High-MOS chip CHP(H) and the High-MOS clip CLP(H) can be ensured sufficiently. Thereby, it is possible to suppress the reduction of the thickness of the high melting point solder HS2 at the time of the heat process (reflow) of the high melting point solder HS2. As a result, even when the expansion and contraction of the high melting point solder HS2 is repeated due to the temperature cycle, it is possible to suppress the occurrence of a solder crack in the high melting point solder HS2. As a result, according to the present First Embodiment, it is possible to prevent the rise of the connection resistance between the High-MOS chip CHP (H) and the High-MOS clip CLP(H), and thus it is possible to prevent degradation of the electrical characteristics of the semiconductor device.

According to the present First Embodiment, the thickness of the high melting point solder HS2 existing in the first space SPC1 can be ensured without providing protrusions on the rear surface (lower surface) of the High-MOS clip CLP(H) coupled to the upper surface of the High-MOS chip CHP(H) while the flatness of the rear surface of the High-MOS clip CLP(H) is ensured.

As described above, the essential point of the technical idea of the present First Embodiment is that the High-MOS clip is formed as the clip frame CLF instead of individually mounting the High-MOS clip CLP(H) over the High-MOS chip CHP(H). Thereby, for example, as shown in FIG. 23, the clip frame CLF can be arranged over the protruding portions having a predetermined height provided over the jig PED. As a result, according to the present First Embodiment, as shown in FIG. 24, it is possible to provide the first space SPC1 between the High-MOS chip CHP(H) and the High-MOS clip CLP(H) and to maintain the size (in particular, the height) of the first space SPC1. That is, according to the present First Embodiment, it is possible to maintain the height of the first space SPC1 regardless of melting of the high melting point solder HS2 due to the heating process (reflow). Therefore, according to the present First Embodiment, the height of the first space SPC1 can be ensured regardless of melting of the high melting point solder HS2, and thus the thickness of the high melting point solder HS2 can be ensured sufficiently.

As described above, a feature point of the technical idea of the present First Embodiment is that the High-MOS clips CLP(H) and the Low-MOS clips CLP(L) are treated as the clip frame CLF, but in the present First Embodiment, a secondary effect as described below can also be obtained by forming the clip frame CLF.

That is, according to the present First Embodiment, it is possible to overlap each of the product regions PR with each of the unit regions UR in a plan view by only overlapping the clip frame CLF with the lead frame LF 1. This means that the High-MOS clips CLP(H) formed in each of the unit regions UR can be mounted over the High-MOS chips CHP(H) formed in each of the product regions PR at the same time. In the same way, this means that the Low-MOS clips CLP(L) formed in each of the unit regions UR can be mounted over the Low-MOS chips CHP(L) formed in each of the product regions PR at the same time. As a result, according to the present First Embodiment, it is possible to simplify the manufacturing process, and thus manufacturing cost of the semiconductor device PK1 can be reduced.

That is, for example, when the High-MOS clips CLP(H) separated into individual chips are used, each of the High-MOS clips CLP(H) has to be mounted over the each of the High-MOS chips CHP(H), and thus the mounting process is cumbersome and it is difficult to reduce the manufacturing cost. In contrast, according to the present First Embodiment, a plurality of High-MOS clips CLP(H) is integrally formed in the clip frame CLF, and thus the High-MOS clips CLP(H) can be collectively mounted over a plurality of High-MOS chips CHP(H) by arranging the clip frame CLF over the lead frame LF1. Therefore, it is possible to significantly reduce the manufacturing cost.

Furthermore, in the present First Embodiment, as shown in FIG. 23, the heating process (reflow) is performed in a state in which the lead frame LF1 is arranged over the jig PED and the clip frame CLF is arranged over the protruding portions PJU. In this case, as shown in FIG. 24, in a state in which the first space SPC1 is formed between the High-MOS chip CHP(H) and the High-MOS clip CLP(H) and also the first space SPC1 is formed between the Low-MOS chip CHP(L) and the Low-MOS clip CLP(L), the high melting point solders HS2 filling the first spaces SPC1 are melted.

At this time, in the present First Embodiment, for example, as shown in FIG. 24, it is desirable that a second space SPC2 is formed between the High-MOS clip CLP(H) and the chip mounting portion TAB(L) and the second space SPC2 is filled with the high melting point solder HS1. In the same way, it is desirable that the second space SPC2 is formed between the Low-MOS clip CLP(L) and the lead LD and the second space SPC2 is filled with the high melting point solder HS1. Specifically, it is desirable that the lead frame LF1 is arranged over the jig PED and the clip frame CLF is arranged over the protruding portions PJU so that the second space SPC2 is interposed between the second portion SPT(H) of the High-MOS clip CLP(H) and the surface of the chip mounting portion TAB(L) and the second space SPC2 is interposed between the second portion SPT(L) of the Low-MOS clip CLP(L) and the surface of the lead LD.

Specifically, it is desirable that the height position of the second portion SPT(H) of the High-MOS clip CLP(H) and the height position of the second portion SPT(L) of the Low-MOS clip CLP(L) are arranged at positions larger than the thickness of the lead frame LF1. Because, for example, the high melting point solder HS1 also fills the space between the High-MOS clip CLP(H) and the chip mounting portion TAB (L) and it is possible to suppress the occurrence of a solder crack in the high melting point solder HS1 by maintaining the height of the second space SPC2 and ensuring the thickness of the high melting point solder HS1, by the configuration described above. In the same way, for example, the high melting point solder HS1 also fills the space between the Low-MOS clip CLP(L) and the lead LD and it is possible to suppress the occurrence of a solder crack in the high melting point solder HS1 by maintaining the height of the second space SPC2 and ensuring the thickness of the high melting point solder HS1, by the configuration described above.

Here, for example, the size (in particular, the height) of the first space SPC1 provided between the High-MOS chip CHP (H) and the High-MOS clip CLP(H) and between the Low-MOS chip CHP(L) and the Low-MOS clip CLP(L) can be the same as the size (in particular, the height) of the second space SPC2 described above. Because, for example, the high melting point solder HS1 and the high melting point solder HS2 include the same material, and thus it is assumed that the thickness by which the occurrence of the solder crack is suppressed is the same. However, the above-mentioned size (in particular, the height) of the first space SPC1 and the size (in particular, the height) of the second space SPC2 may be different from each other. For example, the components of the high melting point solder HS1 and the components of the high melting point solder HS2 are assumed to be different from each other, and thus the thickness with which the solder crack easily occurs may be different. Therefore, the above-mentioned size (in particular, the height) of the first space SPC1 and the size (in particular, the height) of the second space SPC2 can be arbitrarily set from the viewpoint of suppressing the occurrence of the solder crack.

In the present First Embodiment, there is described the configuration in which, for example, as shown in FIG. 23, the protruding portions PJU are provided over the jig PED and the positioning pins PIN are provided over the protruding portions PJU. However, the configuration of the technical idea according to the present First Embodiment is not limited to this, and for example, the protruding portions PJU and the positioning pins PIN are provided at different positions as seen in a plan view.

Figure 25:
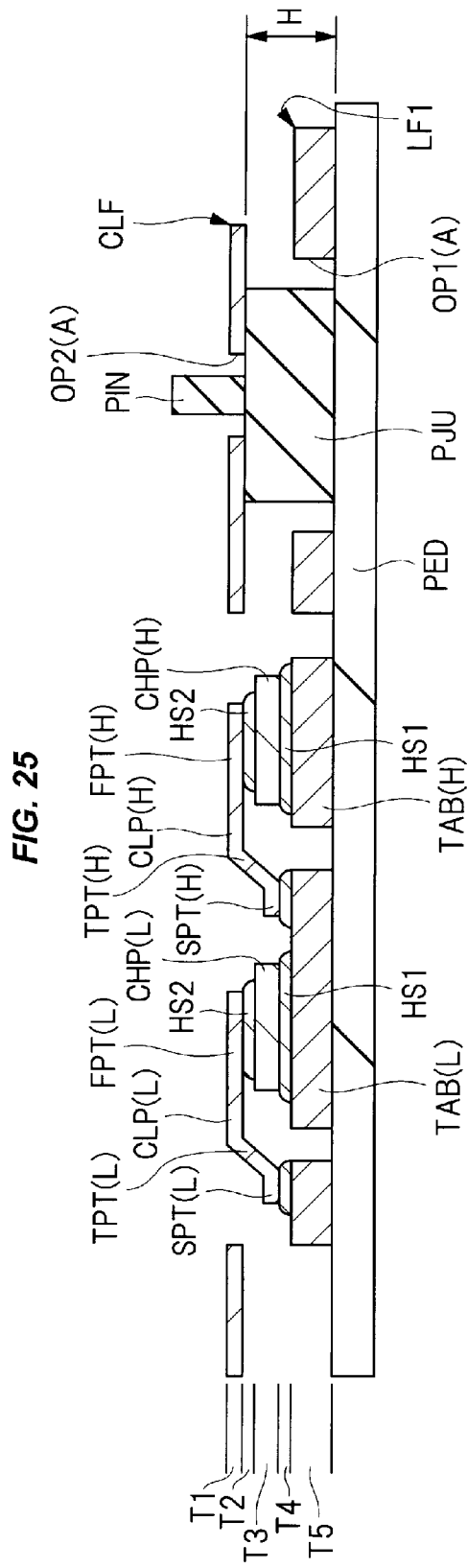
FIG. 25 is a partially enlarged cross-sectional view of FIG. 23.

Next, FIG. 25 is a partially enlarged cross-sectional view of FIG. 23. Hereinafter, an example of specific dimensions of each member will be described with reference to FIG. 25. In FIG. 25, the thickness of the clip frame CLF is uniform anywhere, and thus the thickness of the High-MOS clip CLP (H) and the thickness of the Low-MOS clip CLP(L) are defined as T1. In addition, the thickness of the high melting point solder HS2 is defined as T2 and the thickness of the High-MOS chip CHP(H) or the thickness of the Low-MOS chip CHP(L) (which are referred to as the thickness of the semiconductor chip) are defined as T3. Furthermore, the thickness of the high melting point solder HS1 (thickness of the solder) is defined as T4 and the thickness of the lead frame LF1 is defined as T5. Moreover, the height of the protruding portions PJU is defined as H.

In this case, as shown in FIG. 25, the thickness T1 of the clip is 0.125 mm and the thickness T2 of the solder is 0.025 mm. In addition, the thickness T3 of the semiconductor chip is 0.16 mm and the thickness T4 of the solder is 0.025 mm. Furthermore, the thickness T5 of the lead frame is 0.2 mm and the height H of the protruding portions is 0.41 mm.

From the above, it is known that each of the thickness. T2 of the solder and the thickness T4 of the solder is smaller than the thickness T1 of the clip, the thickness T3 of the semiconductor chip, or the thickness T5 of the lead frame. The thickness T2 of the solder or the thickness T4 of the solder is desired to be thick from the viewpoint of suppressing the solder crack, but when the thicknesses of the solders are too thick, the thickness of the semiconductor device becomes thick, and thus it becomes difficult to thin the semiconductor device. Therefore, for example, the thickness T2 of the solder or the thickness T4 of the solder is smaller than the thickness T1 of the clip, the thickness T3 of the semiconductor chip, or the thickness T5 of the lead frame. In contrast, when the thickness T2 of the solder or the thickness T4 of the solder is too thin, the solder crack easily occurs, and thus the thickness of, for example, approximately 0.025 mm is ensured.

Furthermore, in the present First Embodiment, as shown in FIG. 25, the height H of the protruding portions (=0.41 mm) is greater than the sum of the thickness of the lead frame, the thickness T4 of the solder, and the thickness T3 of the semiconductor chip (=0.2 mm+0.025 mm+0.16 mm=0.385 mm). Thereby, according to the present First Embodiment, for example, as shown in FIG. 25, it is possible to arrange the lead frame LF1 over the jig PED and arrange the clip frame CLF over the protruding portions PJU having a predetermined height provided over the jig PED. As a result, according to the present First Embodiment, as shown in FIG. 24, it is possible to provide the first space SPC1 between the High-MOS chip CHP(H) and the High-MOS clip CLP(H) and maintain the size (in particular, the height) of the first space SPC1. In the same way, according to the present First Embodiment, it is possible to provide the first space SPC1 between the Low-MOS chip CHP(L) and the Low-MOS clip CLP(L) and maintain the size (in particular, the height) of the first space SPC1. Therefore, according to the present First Embodiment, it is possible to maintain the constant height of the first space SPC1 regardless of melting of the high melting point solder HS2 due to the heating process (reflow). Therefore, according to the present First Embodiment, the height of the first space SPC1 can be ensured regardless of melting of the high melting point solder HS2, and thus the thickness of the high melting point solder HS2 can be ensured sufficiently.

As a result, even when the expansion and contraction of the high melting point solder HS2 is repeated due to the temperature cycle, it is possible to suppress the occurrence of a solder crack in the high melting point solder HS2. Thereby, according to the present First Embodiment, it is possible to suppress the rise of the connection resistance between the High-MOS chip CHP(H) and the High-MOS clip CLP(H) and the connection resistance between the Low-MOS chip CHP(L) and the Low-MOS clip CLP(L). Because of this, it is possible to prevent degradation of the electrical characteristics of the semiconductor device.

Second Embodiment

While, in the First Embodiment, there has been described the semiconductor device in which the driver IC chip CHP (C), the High-MOS chip CHP(H) and the Low-MOS chip CHP(L) are sealed by the sealing body, the technical idea of the First Embodiment can also be applied to, for example, a semiconductor device in which the High-MOS chip CHP(H) and the Low-MOS chip CHP(L) are sealed by the sealing body.

Figure 26:
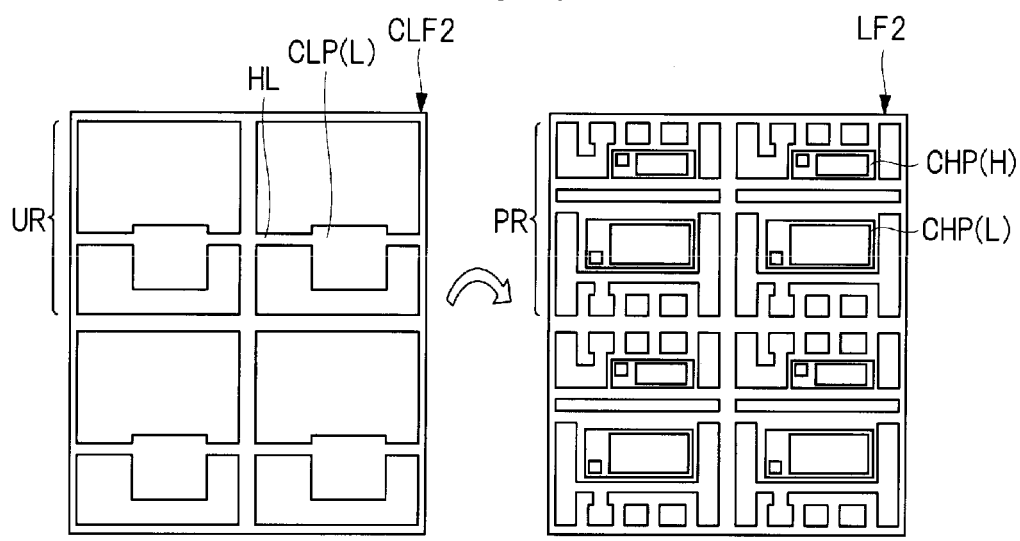
FIG. 26 is a plan view showing a configuration of a lead frame and a clip frame according to a Second Embodiment.

FIG. 26 is a plan view showing a configuration of a lead frame LF2 and a clip frame CLF2 according to a Second Embodiment. As shown in FIG. 26, also in the lead frame LF2 according to the present Second Embodiment, the product regions PR are arranged in a matrix form and the High-MOS chip CHP(H) and the Low-MOS chip CHP(L) are mounted in each product region PR. In contrast, also in the clip frame CLF2 according to the present Second Embodiment, the unit regions UR are arranged in a matrix form, the Low-MOS clip CLP(L) is arranged in each unit region UR, and the Low-MOS clip CLP(L) is supported by the support lead HL. In this way, in the present Second Embodiment, only the Low-MOS clip CLP(L) is formed in the unit region UR of the clip frame CLF2.

Figure 27:
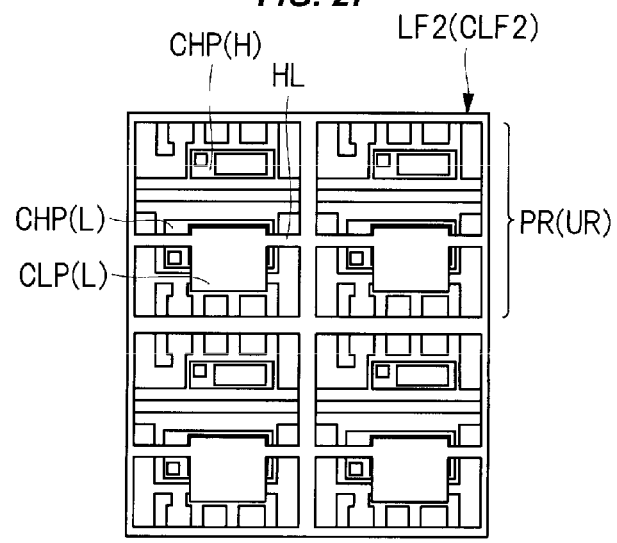
FIG. 27 is a plan view showing a state in which the clip frame is arranged over the lead frame according to the Second Embodiment.

The lead frame LF2 and the clip frame CLF2 configured as described above are arranged to be overlapped with each other. FIG. 27 is a plan view showing a state in which the clip frame CLF2 is arranged over the lead frame LF2 according to the present Second Embodiment. Specifically, also in the present Second Embodiment, in the same way as in the First Embodiment, the lead frame LF2 is arranged over the jig and the clip frame CLF2 is arranged over the protruding portions provided on the jig. At this time, also in the present Second Embodiment, there is a first space between the upper surface of the Low-MOS chip CHP(L) and the lower surface of the Low-MOS clip CLP(L) and the first space is filled with a high melting point solder.

Also in the present Second Embodiment, in a state shown in FIG. 27, the heating process (reflow) for heating the high melting point solder is performed. That is, also in the present Second Embodiment, the heating process (reflow) is performed in a state in which the lead frame LF2 is arranged over the jig and the clip frame CLF2 is arranged over the protruding portions. In this case, in the same way as in the First Embodiment, in a state in which the first space is formed between the Low-MOS chip CHP(L) and the Low-MOS clip CLP(L), the high melting point solder filling the first space is melted.

At this time, also in the present Second Embodiment, the lead frame LF2 is arranged over the jig and the clip frame CLF2 is arranged over the protruding portions, and thus even when the high melting point solder is melted in the first space, the size (in particular, the height) of the first space does not change and the first space is maintained. This means that the size (in particular, the height) of the first space is fixed even when the high melting point solder filling the first space is melted. As a result, also in the present Second Embodiment, it is possible to ensure the height of the high melting point solder, by the height of the first space.

Thus, also in the present Second Embodiment, the height of the first space can be ensured regardless of melting of the high melting point solder, and thus the thickness of the high melting point solder can be ensured sufficiently. As a result, even when the expansion and contraction of the high melting point solder is repeated due to the temperature cycle, it is possible to suppress the occurrence of a solder crack in the high melting point solder. Thereby, also in the present Second Embodiment, it is possible to suppress the rise of the connection resistance between the Low-MOS chip CHP(L) and the Low-MOS clip CLP(L). Because of this, it is possible to prevent degradation of the electrical characteristics of the semiconductor device.

[Modification]

Next, a Modification of the present Second Embodiment will be described. In the Second Embodiment, there has been described an example in which only the Low-MOS clip CLP(L) is used in the technique related to the semiconductor device in which the High-MOS chip CHP(H) and the Low-MOS chip CHP(L) are sealed by the sealing body. In the present modification, there will be described an example in which the High-MOS clip CLP(H) and the Low-MOS clip CLP(L) are used in the technique related to the semiconductor device in which the High-MOS chip CHP(H) and the Low-MOS chip CHP(L) are sealed by the sealing body.

Figure 28:
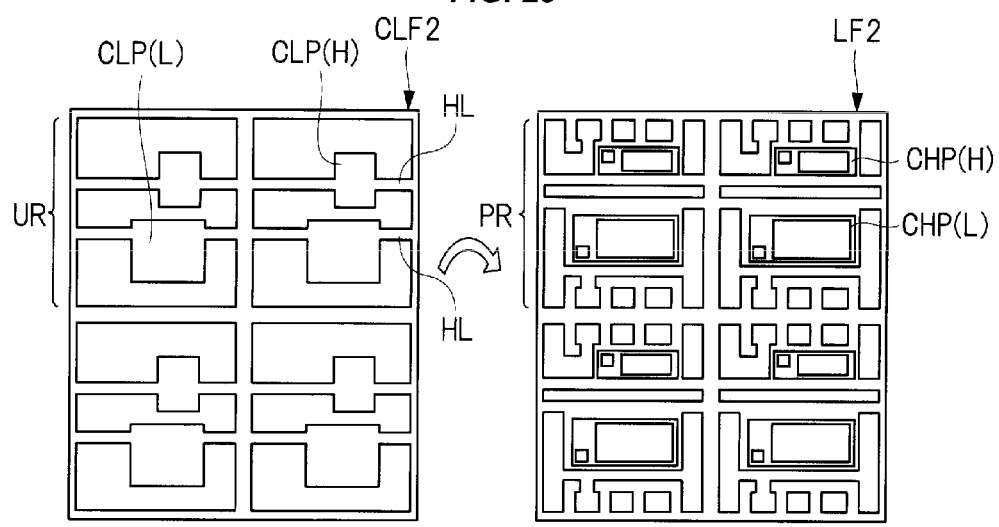
FIG. 28 is a plan view showing a configuration of a lead frame and a clip frame according to a modification.

FIG. 28 is a plan view showing a configuration of the lead frame LF2 and the clip frame CLF2 according to the present modification. As shown in FIG. 28, also in the lead frame LF2 according to the present modification, the product regions PR are arranged in a matrix form and the High-MOS chip CHP (H) and the Low-MOS chip CHP(L) are mounted in each product region PR. In contrast, also in the clip frame CLF2 according to the present modification, the unit regions UR are arranged in a matrix form, the Low-MOS clip CLP(L) and the High-MOS clip CLP(H) are arranged in each unit region UR, and the Low-MOS clip CLP(L) and the High-MOS clip CLP (H) are supported by the support leads HL. In this way, in the present modification, the Low-MOS clip CLP(L) and the High-MOS clip CLP(H) are formed in the unit region UR of the clip frame CLF2.

Figure 29:
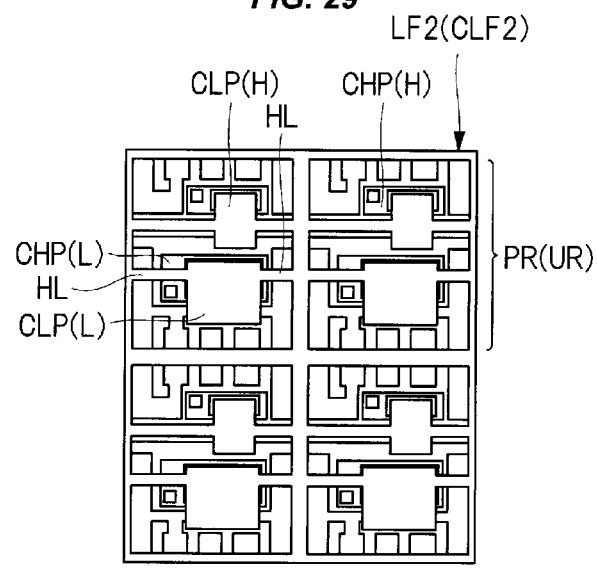
FIG. 29 is a plan view showing a state in which the clip frame is arranged over the lead frame according to the modification.

The lead frame LF2 and the clip frame CLF2 configured as described above are arranged to be overlapped with each other. FIG. 29 is a plan view showing a state in which the clip frame CLF2 is arranged over the lead frame LF2 according to the present modification. Specifically, also in the present modification, in the same way as in the First Embodiment, the lead frame LF2 is arranged over the jig and the clip frame CLF2 is arranged over the protruding portions provided on the jig. At this time, also in the present modification, the first space exists between the upper surface of the Low-MOS chip CHP(L) and the lower surface of the Low-MOS clip CLP(L) and the first space is filled with the high melting point solder. In the same way, in the present modification, the first space exists between the upper surface of the High-MOS chip CHP (H) and the lower surface of the High-MOS clip CLP(H) and the first space is filled with the high melting point solder.

Also in the present modification, in a state shown in FIG. 29, the heating process (reflow) for heating the high melting point solder is performed. That is, also in the present modification, the heating process (reflow) is performed in a state in which the lead frame LF2 is arranged over the jig and the clip frame CLF2 is arranged over the protruding portions. In this case, in the same way as in the First Embodiment, in a state in which the first space is formed between the Low-MOS chip CHP(L) and the Low-MOS clip CLP(L) and also the first space is formed between the High-MOS chip CHP(H) and the High-MOS clip CLP(H), the high melting point solders filling the first spaces are melted.

At this time, also in the present modification, the lead frame LF2 is arranged over the jig and the clip frame CLF2 is arranged over the protruding portions, and thus even when the high melting point solder is melted in the first space, the size (in particular, the height) of the first space does not change and the first space is maintained. This means that the size (in particular, the height) of the first space is fixed even when the high melting point solder filling the first space is melted. As a result, also in the present modification, it is possible to ensure the height of the high melting point solder, by the height of the first space.

Thus, also in the present modification, the height of the first space can be ensured regardless of melting of the high melting point solder, and thus the thickness of the high melting point solder can be ensured sufficiently. As a result, even when the expansion and contraction of the high melting point solder is repeated due to the temperature cycle, it is possible to suppress the occurrence of a solder crack in the high melting point solder. Thereby, also in the present modification, it is possible to suppress the rise of the connection resistance between the Low-MOS chip CHP(L) and the Low-MOS clip CLP(L) and the connection resistance between the High-MOS chip CHP(H) and the High-MOS clip CLP(H). Because of this, it is possible to prevent degradation of the electrical characteristics of the semiconductor device.

Third Embodiment

While, in the First Embodiment, there has been described the semiconductor device in which the driver IC chip CHP (C), the High-MOS chip CHP(H), and the Low-MOS chip CHP(L) are sealed by the sealing body, the technical idea of the First Embodiment can also be applied to, for example, a semiconductor device in which a single semiconductor chip where a power MOSFET (field effect transistor for switching) is formed is sealed by the sealing body.

Figure 30:
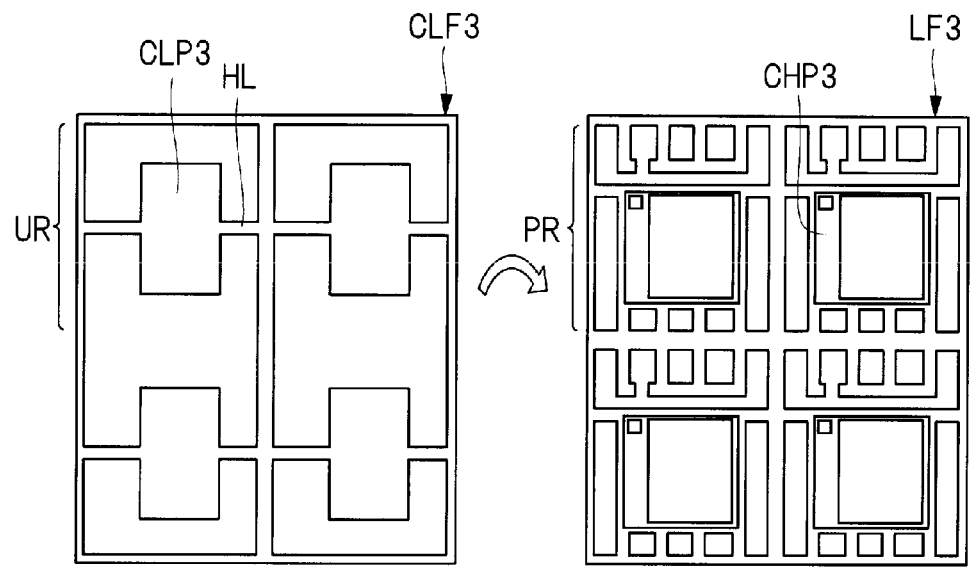
FIG. 30 is a plan view showing a configuration of a lead frame and a clip frame according to a Third Embodiment.

FIG. 30 is a plan view showing a configuration of a lead frame LF3 and a clip frame CLF3 according to a Third Embodiment. As shown in FIG. 30, also in the lead frame LF3 according to the present Third Embodiment, the product regions PR are arranged in a matrix form and a single semiconductor chip CHP3 is mounted in each product region PR. In contrast, also in the clip frame CLF3 according to the present Third Embodiment, the unit regions UR are arranged in a matrix form, a clip CLP3 is arranged in each unit region UR, and the clip CLP3 is supported by the support leads HL.

Figure 31:
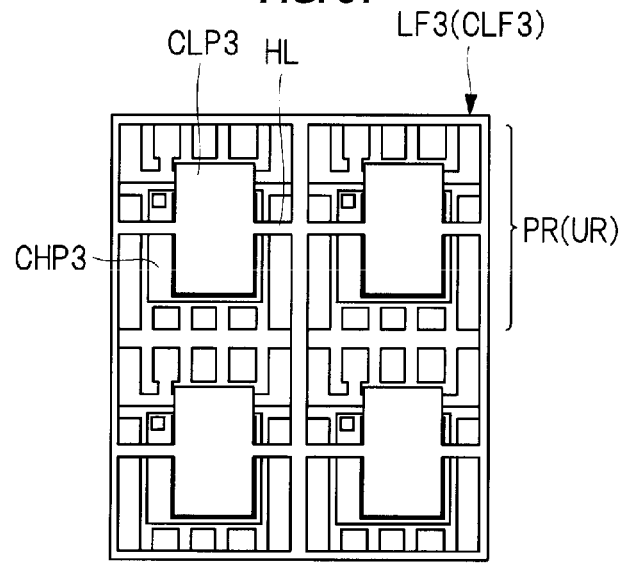
FIG. 31 is a plan view showing a state in which the clip frame is arranged over the lead frame according to the Third Embodiment.

The lead frame LF3 and the clip frame CLF3 configured as described above are arranged to be overlapped with each other. FIG. 31 is a plan view showing a state in which the clip frame CLF3 is arranged over the lead frame LF3 according to the present Third Embodiment. Specifically, also in the present Third Embodiment, in the same way as in the First Embodiment, the lead frame LF3 is arranged over the jig and the clip frame CLF3 is arranged over the protruding portions provided on the jig. At this time, also in the present Third Embodiment, there is a first space between the upper surface of the semiconductor chip CHP3 and the lower surface of the clip CLP3 and the first space is filled with a high melting point solder.

Also in the present Third Embodiment, in a state shown in FIG. 31, the heating process (reflow) for heating the high melting point solder is performed. That is, also in the present Third Embodiment, the heating process (reflow) is performed in a state in which the lead frame LF3 is arranged over the jig and the clip frame CLF3 is arranged over the protruding portions. In this case, in the same way as in the First Embodiment, in a state in which the first space is formed between the semiconductor chip CHP3 and the clip CLP3, the high melting point solder filling the first space is melted.

At this time, also in the present Third Embodiment, the lead frame LF3 is arranged over the jig and the clip frame CLF3 is arranged over the protruding portions, and thus even when the high melting point solder is melted in the first space, the size (in particular, the height) of the first space does not change and the first space is maintained. This means that the size (in particular, the height) of the first space is fixed even when the high melting point solder filling the first space is melted. As a result, also in the present Third Embodiment, it is possible to ensure the height of the high melting point solder, by the height of the first space.

Therefore, also in the present Third Embodiment, the height of the first space can be ensured regardless of melting of the high melting point solder, and thus the thickness of the high melting point solder can be ensured sufficiently. As a result, even when the expansion and contraction of, the high melting point solder is repeated due to the temperature cycle, it is possible to suppress the occurrence of a solder crack in the high melting point solder. Thereby, also in the present Third Embodiment, it is possible to suppress the rise of the connection resistance between the semiconductor chip CHP3 and the clip CLP3. Because of this, it is possible to prevent degradation of the electrical characteristics of the semiconductor device.

In final summary, some of the main features described above can be applied to not only a semiconductor device including a plurality of chips and a plurality of clips, but also a semiconductor device including one chip and one clip.

Hereinbefore, although the invention made by the inventors has been specifically explained on the basis of the embodiments, it is needless to say that the present invention is not limited to the above-mentioned embodiments and can be modified variously within the scope not departing from the gist thereof.

What is claimed is:

1. A manufacturing method of a semiconductor device, comprising the steps of:
   (a) preparing a first lead frame in which a plurality of first regions, each of which includes a chip mounting portion and a lead, are arranged in a matrix form;
   (b) mounting a semiconductor chip over an upper surface of the chip mounting portion via a first conductive adhesive material;
   (c) preparing a second lead frame in which a plurality of second regions, each of which includes a metal plate, are arranged in a matrix form at the same arrangement pitch as that of the first regions in the first lead frame;
   (d) mounting the metal plate on an electrode pad of the semiconductor chip and the lead via a second conductive adhesive material by overlapping the second lead frame over the first lead frame so that the metal plate is positioned over the electrode pad of the semiconductor chip;
   (e) after step (d), heating the first conductive adhesive material and the second conductive adhesive material at a first temperature; and
   (f) forming a sealing body by collectively sealing the first regions in the first lead frame to cover the semiconductor chips,
   wherein the metal plate includes a first portion coupled to the electrode pad of the semiconductor chip, a second portion coupled to the lead, and a third portion connecting the first portion and the second portion,
   wherein in step (d), the second lead frame is mounted over the first lead frame so that there is a first space between the first portion of the metal plate and the electrode pad of the semiconductor chip and the second conductive adhesive material is in contact with the first portion of the metal plate and the electrode pad of the semiconductor chip in the first space, and
   wherein step (e) is performed in a state in which the first space is maintained.

2. The manufacturing method of a semiconductor device according to claim 1,
   wherein step (d) is performed by arranging the first lead frame and the second lead frame over a jig,
   wherein the jig includes a protruding portion over a main surface of the jig,
   wherein a height of the protruding portion from the main surface is greater than a sum of a thickness of the chip mounting portion, a thickness of the first conductive adhesive material, and a thickness of the semiconductor chip, and
   wherein step (d) is performed by arranging the first lead frame over the main surface of the jig and arranging the second lead frame over the protruding portion of the jig.

3. The manufacturing method of a semiconductor device according to claim 2,
   wherein the jig includes a positioning pin over the main surface,
   wherein the first lead frame includes a first positioning hole into which the positioning pin of the jig is inserted,
   wherein the second lead frame includes a second positioning hole into which the positioning pin of the jig is inserted, and
   wherein the second positioning hole of the second lead frame is formed in the second lead frame so that the first portion of the metal plate of the second lead frame is positioned immediately above the electrode pad of the semiconductor chip, when the positioning pin of the jig is inserted into the first positioning hole of the first lead frame and the second positioning hole of the second lead frame.

4. The manufacturing method of a semiconductor device according to claim 3,
   wherein step (e) is performed in a state in which the first lead frame and the second lead frame are arranged over the jig.

5. The manufacturing method of a semiconductor device according to claim 4,
   wherein the first positioning holes of the first lead frame and the second positioning holes of the second lead frame have, respectively, at least two holes, and
   in each lead frame, one of the two holes has a circular shape and the other hole has an elongated hole shape.

6. The manufacturing method of a semiconductor device according to claim 3,
   wherein a size of the positioning pin is smaller than a size of the protruding portion and the positioning pin is provided over the protruding portion, wherein the first positioning hole formed in the first lead frame has a size into which the protruding portion and the positioning pin are inserted, and wherein the second positioning hole formed in the second lead frame has a size into which the positioning pin is inserted.

7. The manufacturing method of a semiconductor device according to claim 1, further comprising the step of:

(g) after step (f), cutting off regions between the respective first regions in the first lead frame, to separate the first regions into individual chips, wherein the metal plate provided in the second lead frame is supported by a support lead in the second region, and wherein in step (g), the support leads in the second lead frame are also cut off when the regions between the first regions in the first lead frame are cut off.

8. The manufacturing method of a semiconductor device according to claim 7, wherein, after step (g), a cut surface of the support lead is exposed from a side surface of the sealing body and forms the same plane with the side surface of the sealing body.

9. The manufacturing method of a semiconductor device according to claim 1, wherein, in step (d), the second lead frame is arranged over the first lead frame so that there is a second space between the second portion of the metal plate and the lead and the second conductive adhesive material is in contact with the second portion of the metal plate and the lead in the second space.

10. The manufacturing method of a semiconductor device according to claim 9, wherein the height of the first space and the height of the second space are the same.

11. The manufacturing method of a semiconductor device according to claim 9, wherein the first portion of the metal plate is located at a position higher than the second portion of the metal plate.

12. The manufacturing method of a semiconductor device according to claim 1, wherein a surface of the first portion of the metal plate is a flat surface, the surface being coupled to the electrode pad of the semiconductor chip.

13. The manufacturing method of a semiconductor device according to claim 1, wherein the semiconductor chip includes a field effect transistor for switching and also includes a surface where the electrode pad is formed and a rear surface opposite to the surface, and the electrode pad is a source electrode pad and a drain electrode is formed on the rear surface.

14. The manufacturing method of a semiconductor device according to claim 1, wherein the first conductive adhesive material and the second conductive adhesive material are solder.

15. A manufacturing method of a semiconductor device, comprising the steps of:

(a) preparing a first lead frame in which a plurality of first regions, each of which includes a first chip mounting portion, a second chip mounting portion, a third chip mounting portion, and a lead, is arranged in a matrix form;

(b) preparing a first semiconductor chip including a first field effect transistor for switching, a second semiconductor chip including a second field effect transistor for switching, and a third semiconductor chip including a control circuit that controls the first field effect transistor for switching and the second field effect transistor for switching;

(c) mounting the first semiconductor chip over an upper surface of the first chip mounting portion via a first conductive adhesive material;

(d) mounting the second semiconductor chip over an upper surface of the second chip mounting portion via the first conductive adhesive material;

(e) mounting the third semiconductor chip over an upper surface of the third chip mounting portion via the first conductive adhesive material;

(f) preparing a second lead frame in which a plurality of second regions, each of which includes a first metal plate and a second metal plate, is arranged in a matrix form at the same arrangement pitch as that of the first chip mounting portions in the first regions in the first lead frame;

(g) mounting the first metal plate over a first source electrode pad of the first semiconductor chip and the upper surface of the second chip mounting portion via the second conductive adhesive material and mounting the second metal plate over a second source electrode pad of the second semiconductor chip and the lead via the second conductive adhesive material, by arranging the second lead frame over the first lead frame so that the first metal plate is positioned over the first source electrode pad of the first semiconductor chip and the second metal plate is positioned over the second source electrode pad of the second semiconductor chip;

(h) after step (g), heating the first conductive adhesive material and the second conductive adhesive material at a first temperature; and (i) forming a sealing body by collectively sealing the first regions in the first lead frame so as to cover the first semiconductor chips, the second semiconductor chips, and the third semiconductor chips, wherein the first metal plate includes a first portion coupled to the first source electrode pad of the first semiconductor chip, a second portion coupled to the upper surface of the second chip mounting portion, and a third portion connecting the first portion and the second portion, wherein the second metal plate includes a fourth portion coupled to the second source electrode pad of the second semiconductor chip, a fifth portion coupled to the lead, and a sixth portion connecting the fourth portion and the fifth portion, wherein in step (g), the second lead frame is mounted over the first lead frame so that there is a first space between the first portion of the first metal plate and the first source electrode pad of the first semiconductor chip, the second conductive adhesive material is in contact with the first portion of the first metal plate and the first source electrode pad of the first semiconductor chip in the first space, there is a second space between the fourth portion of the second metal plate and the second source electrode pad of the second semiconductor chip, and the second conductive adhesive material is in contact with the fourth portion of the second metal plate and the second source electrode pad of the second semiconductor chip in the second space, and wherein step (h) is performed in a state in which the first space and the second space are maintained.

16. The manufacturing method of a semiconductor device according to claim 15, wherein the height of the first space and the height of the second space are the same.

17. The manufacturing method of a semiconductor device according to claim 15, further comprising the steps of:
after step (h) and before step (i), electrically coupling a first gate electrode pad of the first semiconductor chip and a first electrode pad of the third semiconductor chip by a first metal wire; and
electrically coupling a second gate electrode pad of the second semiconductor chip and a second electrode pad of the third semiconductor chip by a second metal wire.

* * * * *